United States Patent
Arai et al.

(10) Patent No.: US 6,538,946 B2
(45) Date of Patent: Mar. 25, 2003

(54) SEMICONDUCTOR INTEGRATED CIRCUIT DEVICE

(75) Inventors: Kouji Arai, Kodaira (JP); Shinichi Miyatake, Ome (JP)

(73) Assignees: Hitachi, Ltd., Tokyo (JP); Hitachi ULSI Systems Co., Ltd., Tokyo (JP)

( * ) Notice: Subject to any disclaimer, the term of this patent is extended or adjusted under 35 U.S.C. 154(b) by 0 days.

(21) Appl. No.: 09/897,919

(22) Filed: Jul. 5, 2001

(65) Prior Publication Data

US 2002/0003738 A1 Jan. 10, 2002

(30) Foreign Application Priority Data

Jul. 10, 2000 (JP) .................................. 2000-208480

(51) Int. Cl.$^7$ ................................ G11C 7/02
(52) U.S. Cl. .................. 365/206; 365/207; 365/51
(58) Field of Search .................. 365/206, 51, 205, 365/189.01, 208; 430/311; 257/758

(56) References Cited

U.S. PATENT DOCUMENTS

| | | | | |
|---|---|---|---|---|
| 5,265,050 A | * | 11/1993 | McLaury | 365/189.01 |
| 5,291,432 A | * | 3/1994 | Furutani | 365/51 |
| 6,046,924 A | * | 4/2000 | Isobe et al. | 365/51 |
| 6,046,950 A | * | 4/2000 | Kim | 365/205 |
| 6,165,592 A | * | 12/2000 | Kanai et al. | 430/311 |
| 6,256,246 B1 | * | 7/2001 | Ooishi | 365/205 |
| 6,295,241 B1 | * | 9/2001 | Watanabe et al. | 365/208 |
| 2001/0013659 A1 | * | 8/2001 | Noda et al. | 257/758 |

* cited by examiner

Primary Examiner—Hoai Ho
Assistant Examiner—Thinh T. Nguyen
(74) Attorney, Agent, or Firm—Antonelli, Terry, Stout & Kraus, LLP

(57) ABSTRACT

P-type well regions Ap1 and Ap9 on which first and second pre-charge circuits are formed, and p-type well regions Ap2, Ap3, Ap7 and ap8 on which first and second Y-switch circuits are formed, are formed on both ends of a sense amplifier formation region, respectively. A bit line BL2T, which extends from a first memory cell formation region of first and second memory cell formation regions arranged in both sides of the sense amplifier formation region, arrives at a p-type well region An1 on which a sense amplifier is formed, via both a p-type well region Ap1 on which the first pre-charge circuit is formed and p-type well regions Ap2 and Ap3 on which the Y-switch circuit is formed. Therefore, a wiring region c for arranging wirings other than bit lines can be secured on the extended bit line BL2T.

38 Claims, 19 Drawing Sheets

Memory cell formation region 1 or 2

SEMICONDUCTOR INTEGRATED CIRCUIT DEVICE

BACKGROUND OF THE INVENTION

The present invention relates to a semiconductor integrated circuit device and, in particular, to a technique effectively applicable to a sense amplifier of a DRAM (Dynamic Random Access Memory).

The DRAM (Dynamic Random Access Memory) has a memory cell formation region in which a plurality of memory cells are formed, and a peripheral circuit region in which circuits required for writing and reading information to and from these memory cells, for example, a sense amplifier or the like are formed. Each memory cell comprises a capacitor C, and a transfer MISFETQs whose one end is connected to the capacitor C in series.

These memory cells are formed at a rate of one to two of intersecting points, as shown in FIG. 17, at each of which a word line WL comprising a gate electrode of the transfer MISFETQs and a bit line BL connected to the other end of the transfer MISFETQs intersect.

Meanwhile, a sense amplifier SA is a circuit for amplifying a potential difference between bit lines, and is formed in a sense amplifier formation region, and further, is connected between bit lines (e.g., between bit lines BL3B and BL3T), as shown in FIG. 18. Moreover, in the sense amplifier formation region, there are formed a pre-charge circuit PC connected between bit lines, and a Y-switch circuit YS connected between a bit line and an input/output line, and the like in addition to the sense amplifier.

SUMMARY OF THE INVENTION

However, as the interval between the bit lines become narrower in accordance with fineness of the memory cells in size, the sense amplifier SA, pre-charge circuit PC, Y-switch circuit, and the like must be made fine as corresponding thereto.

But, in order to write and read information at a high speed, gate dimension and diffusion layer constant must be secured to some degree. Further, a MISFET constituting the sense amplifier or the like can not be made fine similarly to the transfer MISFETQs constituting the memory cell.

Therefore, even if the memory cell is made fine, a chip occupancy area of DRAM is difficult to reduce because it is difficult to make a peripheral circuit such as a sense amplifier or the like fine.

In particular, in case where memory cells are formed at all the intersecting points of word lines and bit lines (see FIG. 1), it is possible to reduce the memory cell area to half ($4F^2$) of the case ($8F^2$) shown in FIG. 17. However, since the interval between bit lines becomes narrower, there occurs a problem in an occupancy area of the peripheral circuit such as a sense amplifier.

Moreover, in the sense amplifier formation region, a region of arranging wirings for supplying a pre-charge potential to the pre-charge circuit, wirings for coming into contact with the input/output line, and the like must be secured between the narrow bit lines. However, in particular, in case of forming the memory cell at all the intersecting points of the word lines and the bit lines, the bit lines extend to the sense amplifier formation region without interposing shared MISFETs (SM) shown in FIGS. 17 and 18, so that limits to arrangement of the wirings occur as described hereinafter.

An object of the present invention is to provide reduction of the occupation area in the sense amplifier formation region. Also, other object of the present invention is to provide layouts of the sense amplifier formation region, which can correspond to bit lines of the fined memory cells.

The above-mentioned and other objects and novel features will be apparent from description of the following specification and the accompanying drawings.

The following is a brief description on typical inventions disclosed in the present application.

In the semiconductor integrated circuit device of the present invention, the first and second column selecting circuit regions and the first and second pre-charge circuit regions are respectively formed on both ends of the sense amplifier formation region. And, if the first bit line (BL2T) extending from the first memory cell formation region of the first and second memory cell formation regions arranged on both sides of the sense amplifier formation region, is simply made to extend to and arrive at the sense amplifier circuit region via the first pre-charge circuit region and the first column selecting circuit region, then a wiring region for arranging wirings other than bit lines can be secured on the extended first bit line.

Moreover, the sense amplifier circuit region comprises a first region for forming an n-channel type MISFET constituting a first sense amplifier, a second region for forming an n-channel type MISFET constituting a second sense amplifier, a third region for forming a p-channel type MISFET constituting the second sense amplifier, and a fourth region for forming a p-channel type MISFET constituting the second sense amplifier. And, the second and fourth regions are arranged in a state of being shifted in a direction perpendicular to the bit line relative to the first and third regions. Therefore, an interval between the bit lines connected to the sense amplifier can be made narrower.

DETAILED DESCRIPTION OF THE PREFERRED EMBODIMENTS

Figure 1:
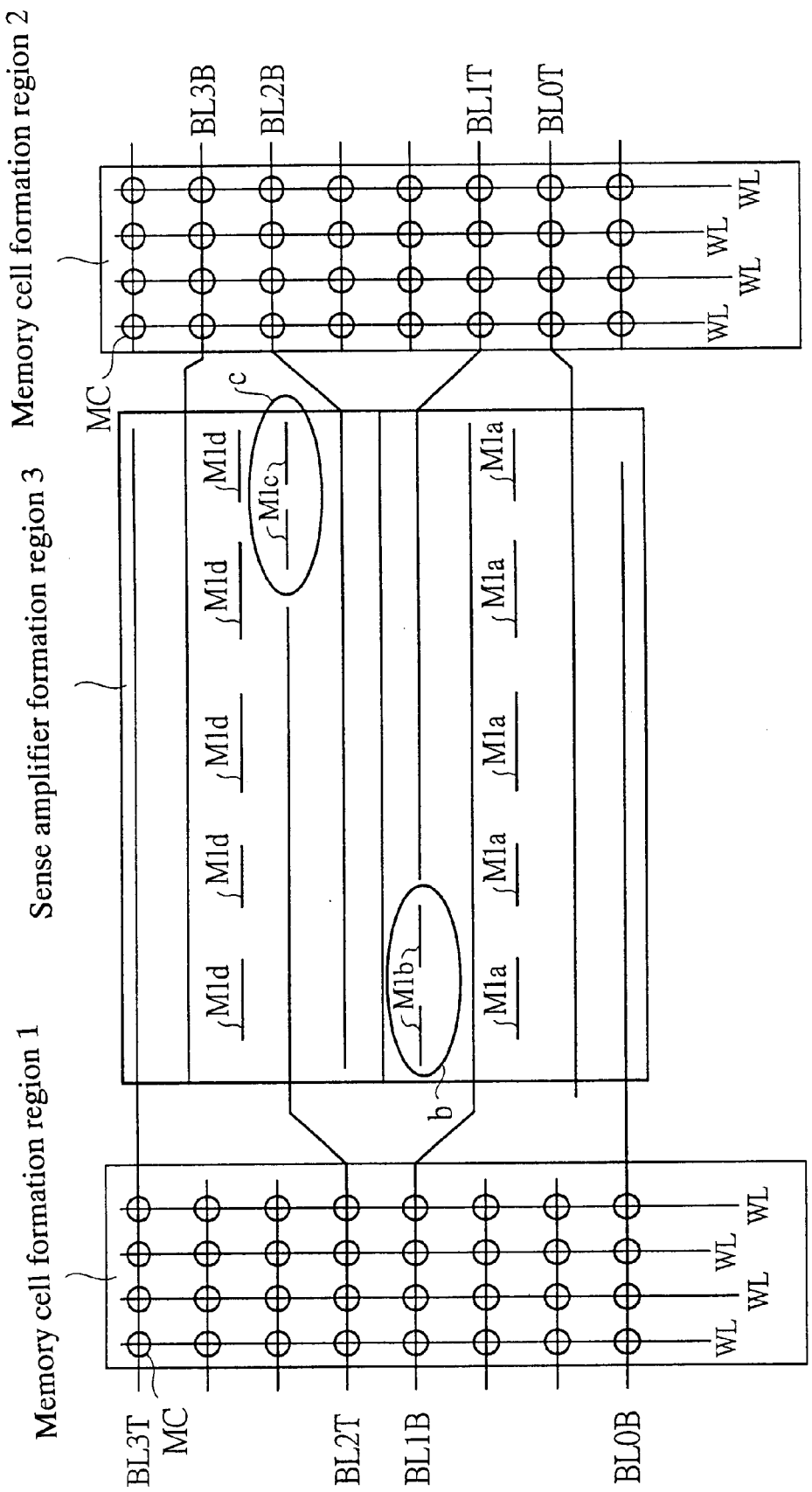
FIG. 1 is a view showing a circuit layout of a semiconductor integrated circuit device that is one embodiment of the present invention.

Preferred embodiments of the present invention will be described in detail below with reference to the accompanying drawings. In all drawings for explaining the preferred embodiments, the same reference numerals are used to designate parts having the same function, and the repetitive explanation thereof will be omitted.

FIG. 1 is a view schematically showing a configuration of DRAM (Dynamic Random Access Memory) that is one embodiment of the present invention. As shown in FIG. 1, a sense amplifier formation region 3 is put between memory cell formation regions 1 and 2. In the memory cell formation region, memory cells MC (shown by a symbol ○ in FIG. 1) are arranged like a matrix at intersecting points of bit lines BL0B to BL3B and BL0T to BL3T and word lines WL.

Figure 2:
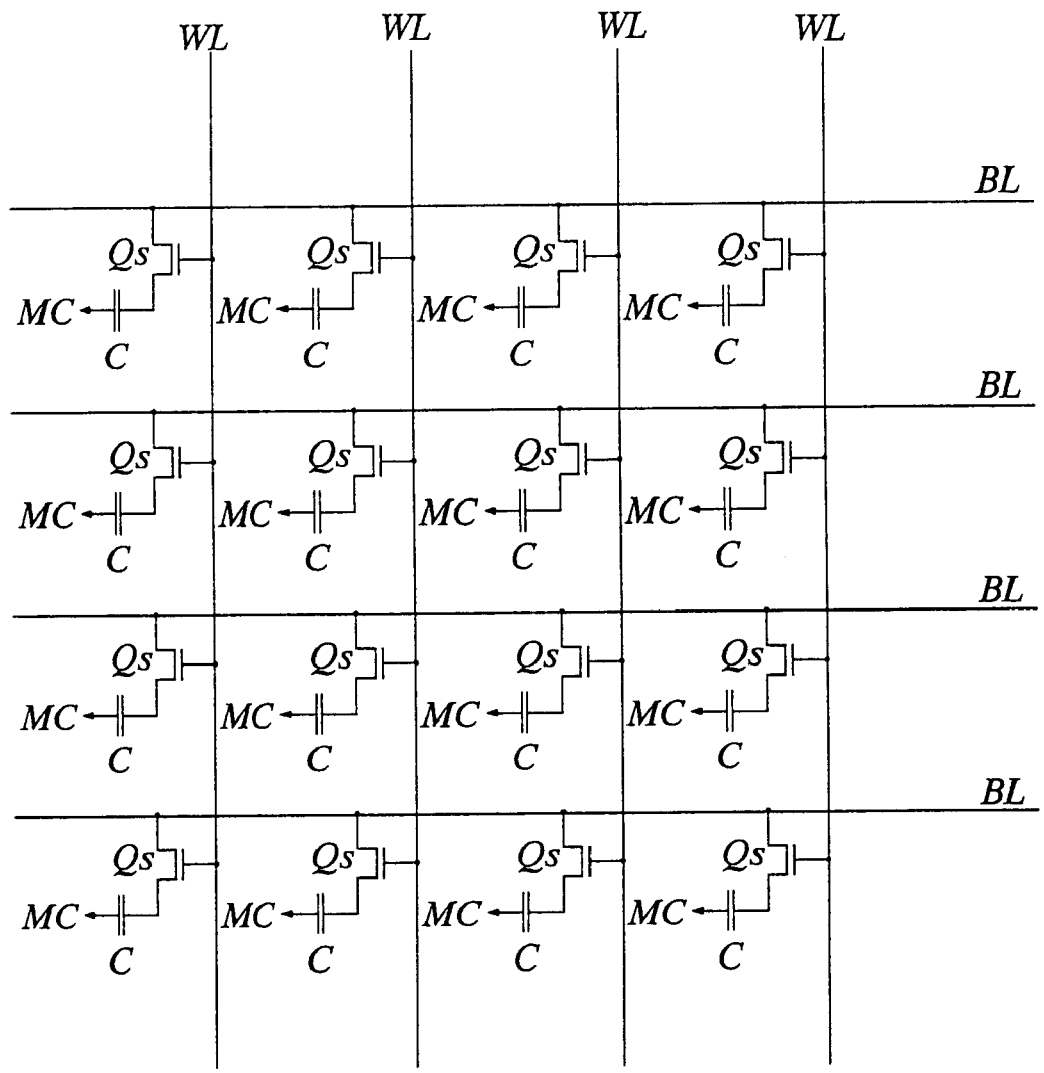
FIG. 2 is a view showing a circuit configuration of a memory cell formation region of the semiconductor integrated circuit device that is one embodiment of the present invention.
Figure 2:
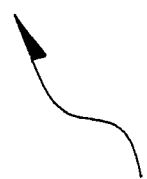

Each of the memory cells MC has a transfer MISFETQs connected in series between the bit lines (BL0B to BL3B, BL0T to BL3T, etc.) and a ground (earth) potential, and a capacitor C, as shown in FIG. 2. A gate electrode of the transfer MISFETQs is connected to a word line WL.

Figure 3:
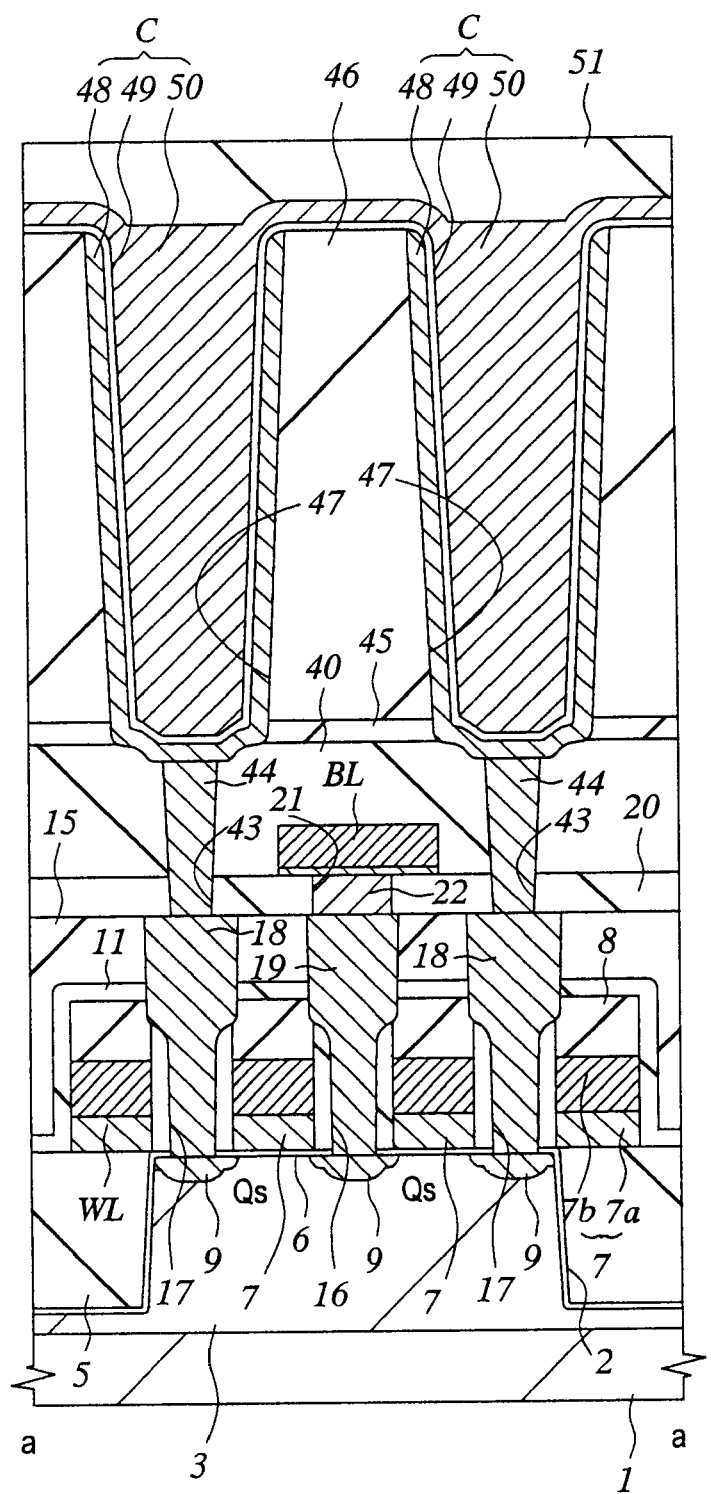
FIG. 3 is a cross-sectional view showing principal parts of a substrate in the memory cell formation region of the semiconductor integrated circuit device that is one embodiment of the present invention.
Figure 4:
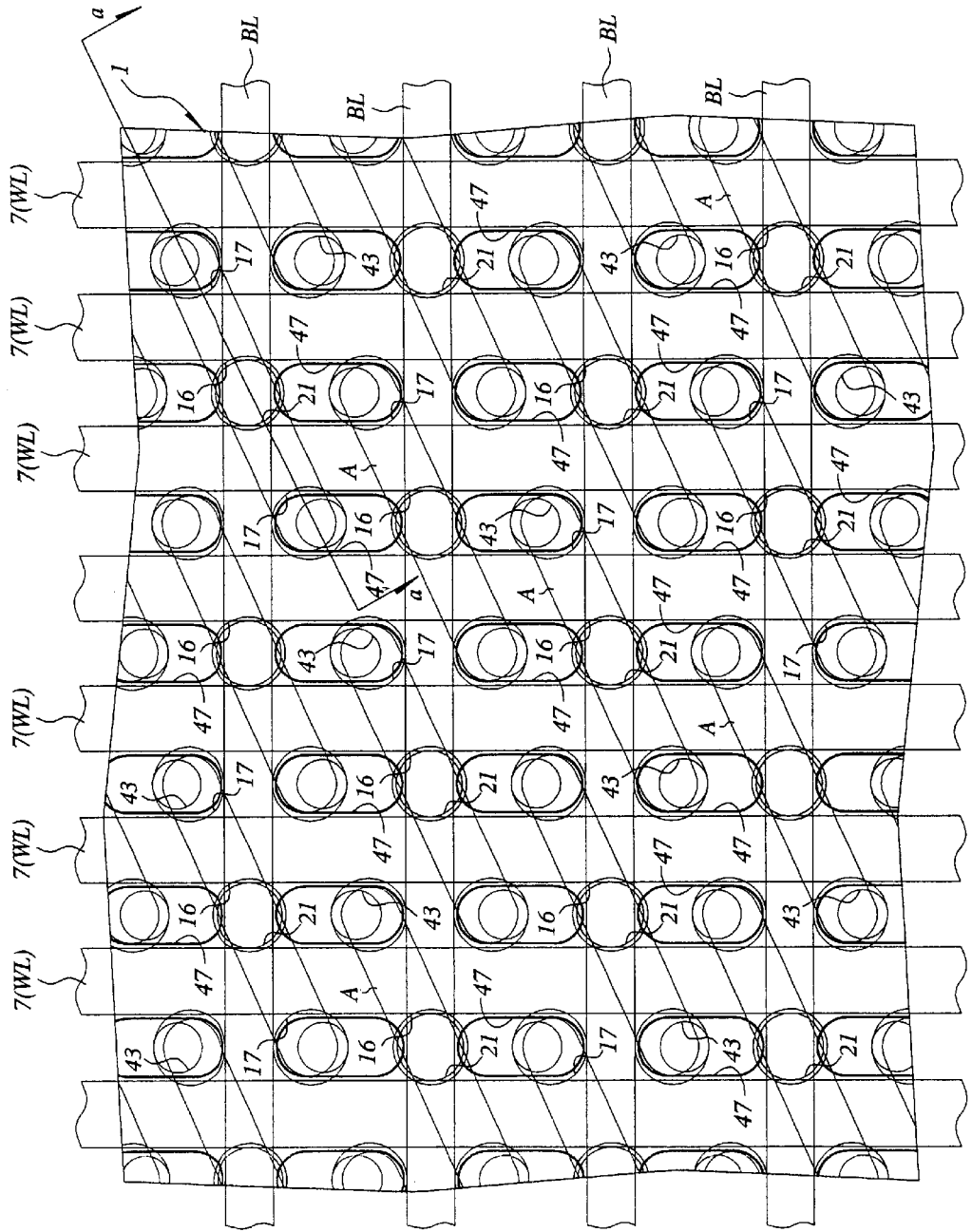
FIG. 4 is a top plan view showing principal parts of the substrate in the memory cell formation region of the semiconductor integrated circuit device that is one embodiment of the present invention.

FIG. 3 is an example showing a cross-sectional view of the memory cell MC formation region. FIG. 4 is an example showing a top plan view of the memory cell formation region, and FIG. 3 corresponds to a cross-sectional view taken along line a—a of FIG. 4.

As shown in FIGS. 3 and 4, the memory cell comprises a transfer MISFETQs formed on the main surface of a semiconductor substrate 1, and a capacitor C connected to the transfer MISFETQs in series.

The transfer MISFETQs has a gate electrode 7 formed through a gate oxide film 6 on a p-type well 3 of the semiconductor substrate 1 which is surrounded by an element isolation 2, and a source-drain region 9 having an LDD structure and formed in the p-type well 3 on both sides of the gate electrode 7. The gate electrode 7 comprises a laminated film formed of a polycrystalline film 7a having a low resistance, a WN film (not shown), and a W film 7b. The upper and side portions of the gate electrode 7 are covered with silicon nitride films 8 and 11. In this case, the gate electrode 7 formed in the memory cell formation region functions as a word line WL.

The capacitor C comprises a lower electrode 48 formed of a polycrystalline silicon film, a capacitance insulating film 49 consisting of a tantalum oxide film and the like, and an upper electrode 50 formed of a TiN film. Further, the capacitor C is provided in a groove 47 formed in a silicon oxide film 46 and a silicon nitride film 45.

The transfer MISFETQs and the capacitor C are connected to each other via a plug 18 formed on the source-drain region 9 and a plug 44 formed on the plug 18. Moreover, the bit line BL is formed via a plug 23 on a plug 19 formed on the source-drain region 9. In this case, the plug 18 is formed in a contact hole 17 provided in a silicon oxide film 15 and a silicon nitride film 11, and the plug 19 is formed in a contact hole 16 provided in the silicon oxide film 15 and the silicon nitride film 11. Further, the plug 22 is formed in a contact hole 21 provided in a silicon oxide film 20, and the plug 44 is formed in a contact hole 43 provided in silicon oxide films 40 and 20.

In addition, a silicon oxide film 51 is formed on the capacitor C, and a second layer wiring M2 not shown is formed on the silicon oxide film 51. Further, a third layer wiring M3 is formed on the second layer wiring M2 via a interlayer dielectric.

Figure 5:
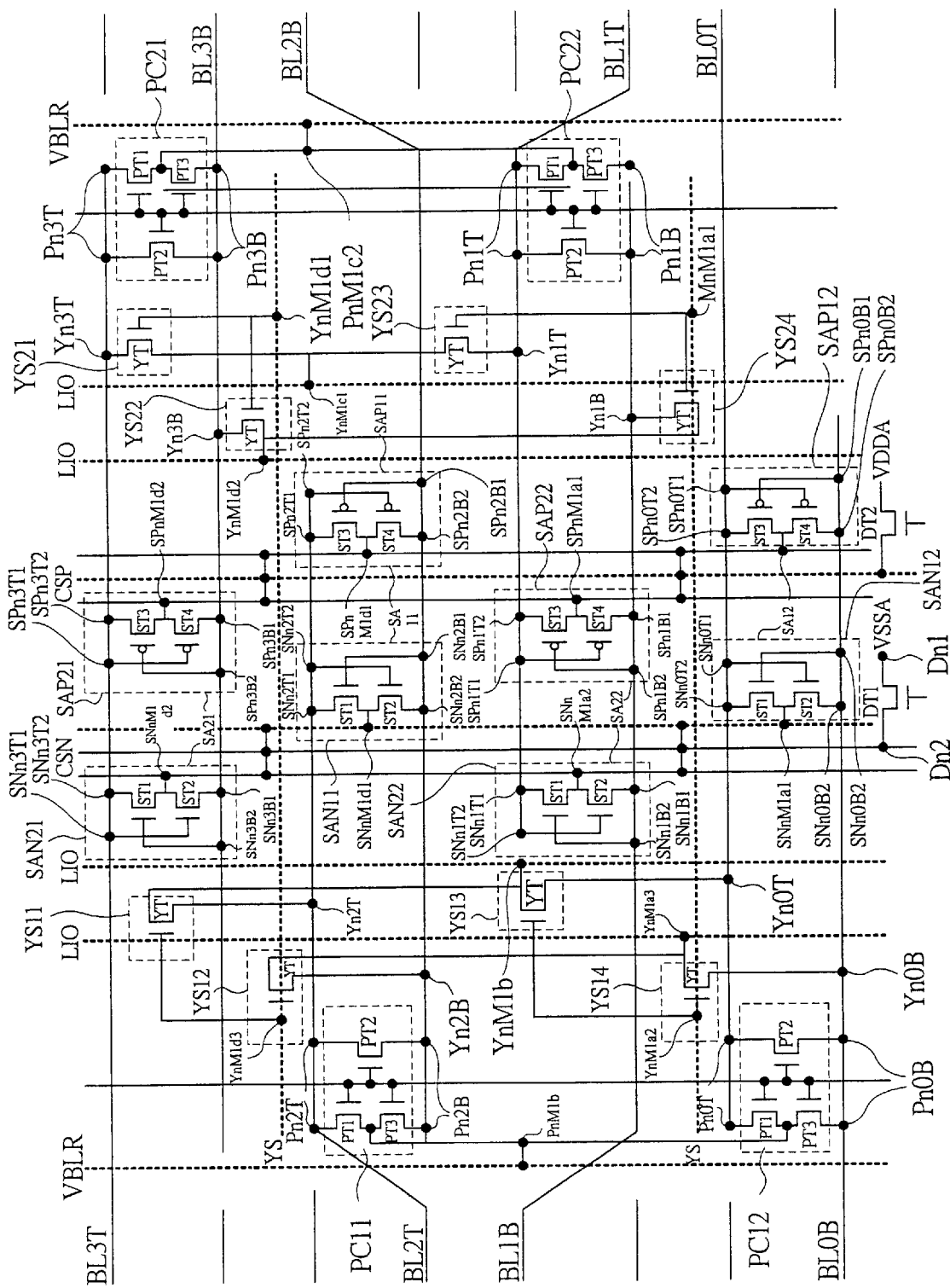
FIG. 5 is a view showing a circuit configuration of the sense amplifier formation region of the semiconductor integrated circuit device that is one embodiment of the present invention.

Next, the sense amplifier formation region 3 will be described below. The sense amplifier formation region 3 of FIG. 1 has pre-charge circuits PC11, PC12, PC21 and PC22, Y-switch circuits YS11 to YS14 and YS21 to YS24, and sense amplifier circuits SAN11, SAN12, SAN21, SAN22, SAP11, SAP12, SAP21 and SAP22 formed therein, as shown in FIG. 5. In this case, one sense amplifier circuit SA11 is constituted by both SAN11 and SAP11, for example.

Each of the pre-charge circuits PC11, PC12, PC21 and PC22 is a circuit for setting a bit line to a predetermined potential before the memory cell is operated, and comprises two MISFETs PT1 and PT3 connected in series between bit lines, and a MISFET PT2 connected between the same bit lines. Gate electrodes of these MISFETs PT1, PT2 and PT3 are connected in common, and each connection node of two MISFETs PT1 and PT3 is connected to a VBLR line.

The pre-charge circuit PC11 will be described below as an example. The two MISFETs PT1 and PT3 constituting the pre-charge circuit PC11 are connected in series between bit lines BL2T and BL2B (between nodes Pn2T and Pn2B). Moreover, MISFET PT2 constituting the pre-charge circuit PC11 is connected in series between the bit lines BL2T and BL2B (between the nodes Pn2T and Pn2B). Each gate electrode of these MISFETs PT1 to PT3 is connected in common. Moreover, a connection node PnM1b of two MISFETs PT1 and PT3 is connected to a VBLR line.

The MISFETs PT1 to PT3 constituting the pre-charge circuit PC12 are connected between bit lines BL0T and BL0B, likewise. The MISFETs PT1 to PT3 constituting the pre-charge circuit PC21 are connected between bit lines BL3T and BL3B, likewise. The MISFETs PT1 to PT3 constituting the pre-charge circuit PC22 are connected between bit lines BL1T and BL1B, likewise.

Each of the Y-switch circuits (column selecting circuits) YS11 to YS14 and YS21 to YS24 comprises a MISFET YT connected between a bit line and an input-output line LIO, and performs a control for writing or reading information to or from the memory cell. A gate electrode of this MISFET YT is connected to a column selecting signal line YS.

The Y-switch circuit YS11 will be described below as an example. The MISFET YT constituting the Y-switch circuit YS11 is connected between the bit line BL2T (node Yn2T) and an LIO line (node YnM1b). A gate electrode of this MISFET YT is connected to the column selecting signal line YS (node YnM1d3).

Likewise, each of the MISFETs YT constituting other Y-switch circuits YS12 to YS14 is connected between the bit line BL2B and anther LIO line, between the bit line BL0T and the LIO line, and between the bit line BL0B and another LIO line. Moreover, likewise, each of the MISFETs YT constituting other Y-switch circuits YS21 to YS24 is connected between the bit line BL3T and still another LIO line, between the bit line BL3B and other LIO line, between the bit line BL1T and still another LIO line, and between the bit line BL1B and other LIO line.

Each of sense amplifier circuits SA11, SA12, SA21 and SA22 is a circuit for amplifying a potential difference between bit lines. The sense amplifier circuit SA11 is constituted by the SAN11 comprising two n-channel type MISFETs and the SAP11 comprising two p-channel type MISFETs. Likewise, the sense amplifier circuit SA12 is constituted by the SAN12 and SAP12, the sense amplifier circuit SA21 is constituted by the SAN21 and SAP21, and the sense amplifier circuit SA22 is constituted by the SAN22 and SAP22.

Two n-channel type MISFETs ST1 and ST2 constituting the sense amplifier circuit are connected in series between bit lines, and two p-channel type MISFETs ST3 and ST4 constituting the sense amplifier circuit are connected in series between the same bit lines. Each one end of the n-channel type MISFET ST1 and the p-channel type MISFET ST3 is connected to one bit line, and these gate electrodes are connected via the other bit line. Moreover, each one end of the n-channel type MISFET ST2 and the p-channel type MISFET ST4 is connected to the other bit line, and these gate electrodes are connected via the one bit line. That is, the gate electrodes of the n-channel type MISFET ST1 and the p-channel type MISFET ST3 and the gate electrodes of the n-channel type MISFET ST2 and the p-channel type MISFET ST4 are connected as intersected.

The sense amplifier circuit SA11 will be described below as an example. Two n-channel type MISFETs ST1 and ST2 constituting the sense amplifier circuit SA11 are connected in series between the bit lines BL2T and BL2B (between nodes SNn2T1 and SNn2B2). And, two p-channel type MISFETs ST3 and ST4 constituting the sense amplifier circuit SA11 are connected in series between the bit lines BL2T and BL2B (between nodes SPn2T1 and SPn2B2).

One end (node SNn2T1) of the n-channel type MISFET ST1 and one end (node SPn2T1) of the n-channel type MISFET ST3 are connected to the bit line BL2T, and these gate electrodes (nodes SNn2B1 and SPn2B1) are connected via the bit line BL2B.

Moreover, one end (node SNn2B2) of the n-channel type MISFET ST2 and one end (SPn2B2) of the n-channel type MISFET ST4 are connected to the bit line BL2B, and these gate electrodes (nodes SNn2T2 and SPn2T2) are connected via the bit line BL2T.

A connection node (SNnM1d1) connecting the n-channel type MISFETs ST1 and ST2 is connected to a CSN line. This CSN line is a common wiring (common source line) for driving the sense amplifier SA at a low level.

Moreover, a connection node (SPnM1d1) connecting the p-channel type MISFETs ST3 and ST4 is connected to a CSP line. This CSP line is a common wiring (common source line) for driving the sense amplifier SA at a high level.

Two n-channel type MISFETs ST1 and ST2 constituting the sense amplifier circuit SA12 are likewise connected between the bit lines BL0T and BL0B (between nodes SNn0T2 and SNn0B2). Moreover, two p-channel type MISFETs ST3 and ST4 constituting the sense amplifier circuit SA12 are connected in series between the bit lines BL0T and BL0B (between nodes SPn0T2 and SPn0B2).

Further, two n-channel type MISFETs ST1 and ST2 constituting the sense amplifier circuit SA21 are connected in series between the bit lines BL3T and BL3B (between nodes SNn3T2 and SNn3B1), likewise. Moreover, two p-channel type MISFETs ST3 and ST4 constituting the sense amplifier circuit SA21 are connected in series between the bit lines BL3T and BL3B (between nodes SPn3T2 and SPn3B1).

Further, two n-channel type MISFETs ST1 and ST2 constituting the sense amplifier circuit SA22 are connected in series between the bit lines BL1T and BL1B (between nodes SNn1T1 and SNn1B1). Moreover, two p-channel type MISFETs ST3 and ST4 constituting the sense amplifier circuit SA22 are connected in series between the bit lines BL1T and BL1B (between nodes SPn1T2 and SPn1B1).

A MISFET DT1 is connected between the CSN line and a VSSA supply line (between nodes Dn2 and Dn1), and further, a MISFET DT2 is connected between the CSP line and a VDDA supply line. This VSSA supply line is a power-supply wiring for supplying a potential for setting a bit line to a low level. The VDDA supply line is a power-supply wiring for supplying a potential for setting a bit line to a high level.

Figure 6:
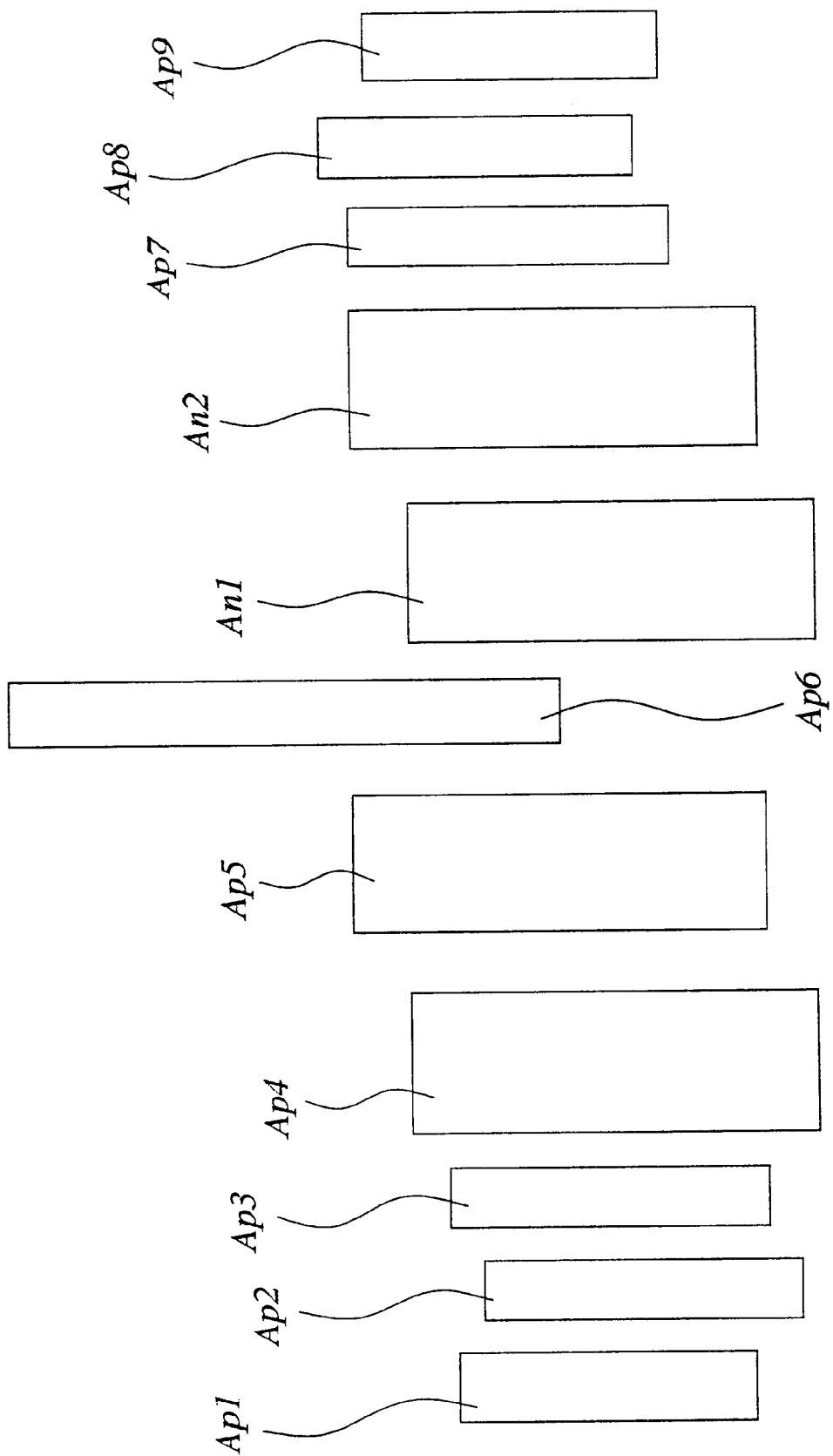
FIG. 6 is a view showing a circuit layout of the sense amplifier formation region of the semiconductor integrated circuit device that is one embodiment of the present invention.
Figure 7:
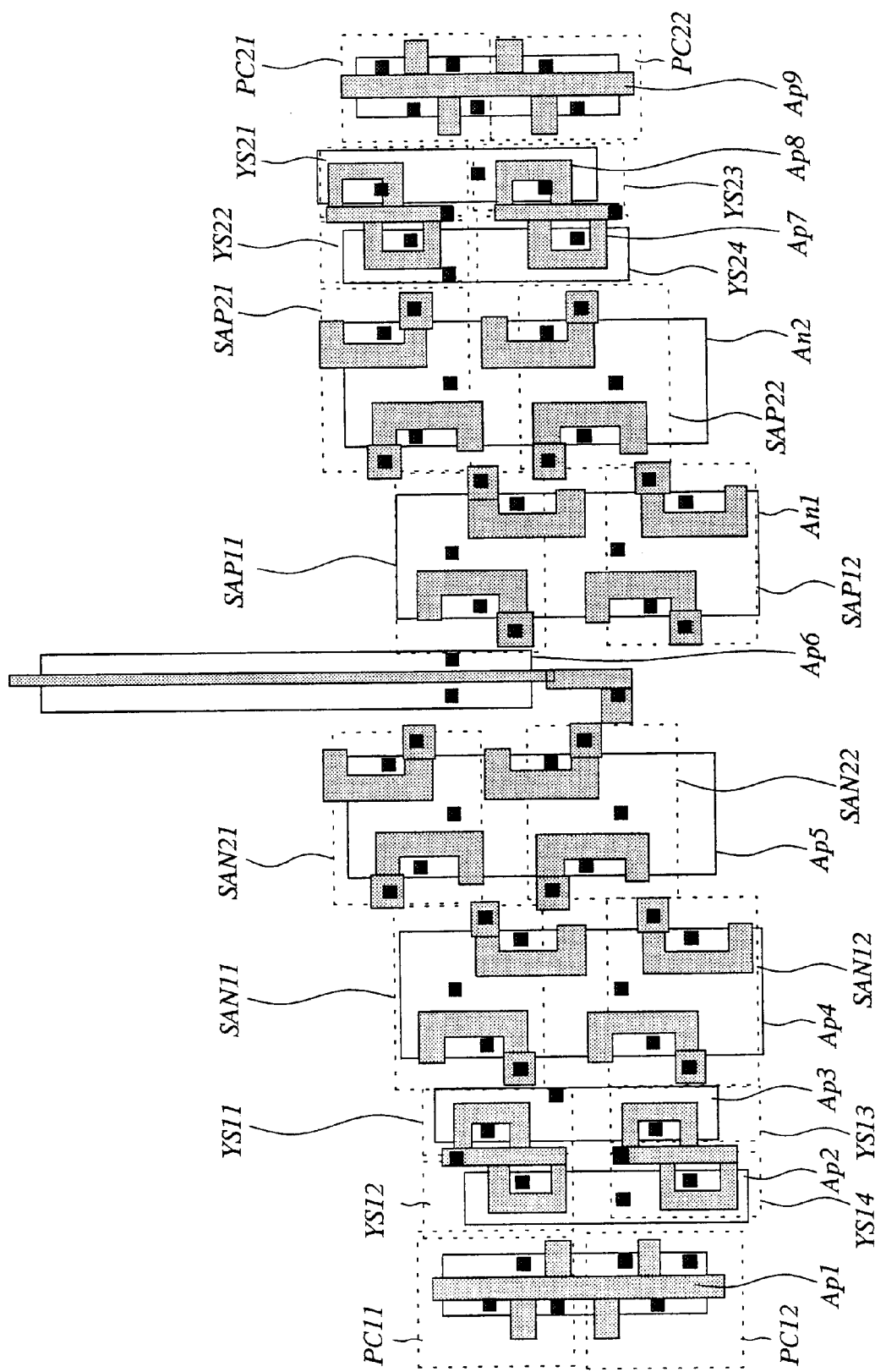
FIG. 7 is a view showing a circuit layout of the sense amplifier formation region of the semiconductor integrated circuit device that is one embodiment of the present invention.
Figure 8:
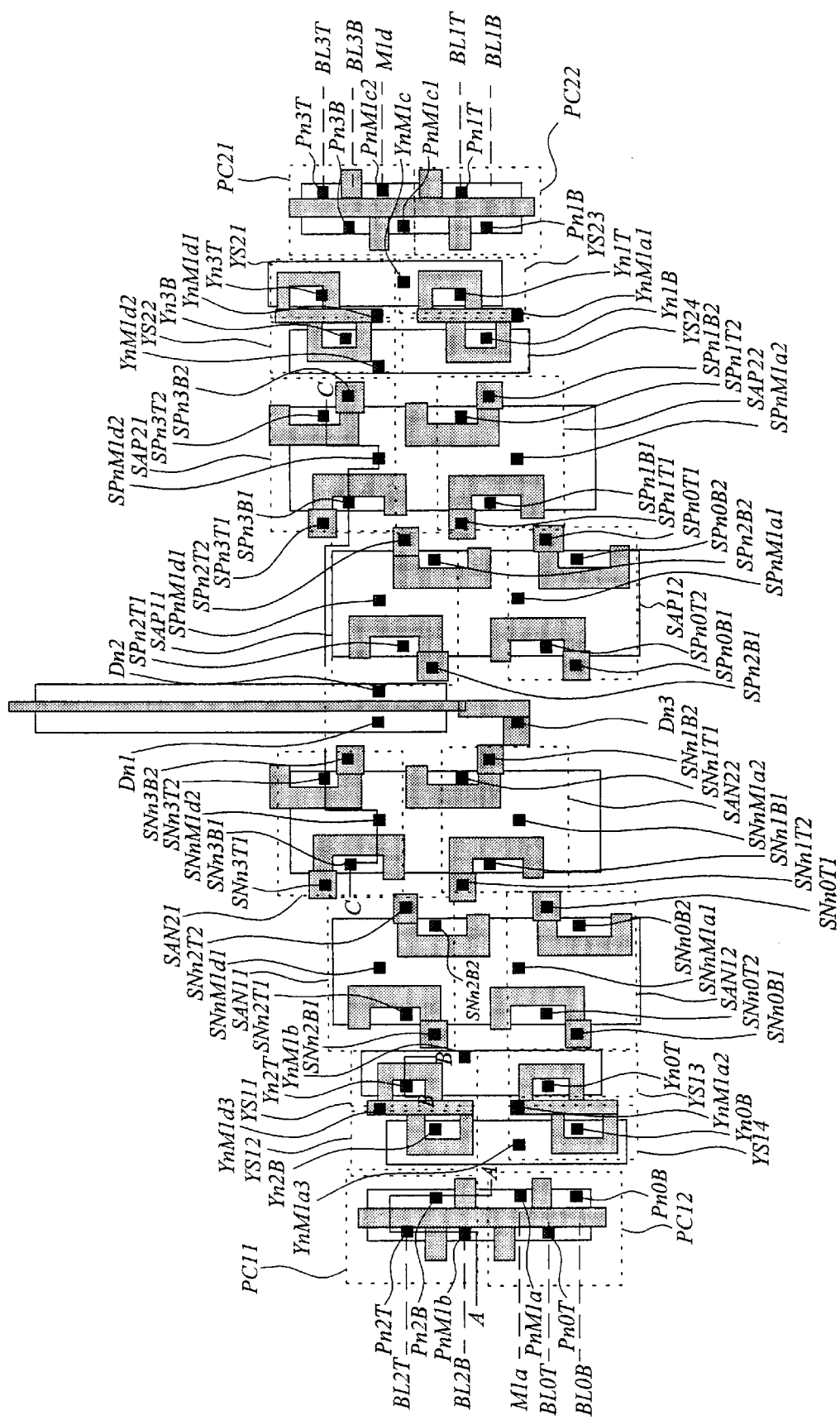
FIG. 8 is a view showing a circuit layout of the sense amplifier formation region of the semiconductor integrated circuit device that is one embodiment of the present invention.
Figure 9:
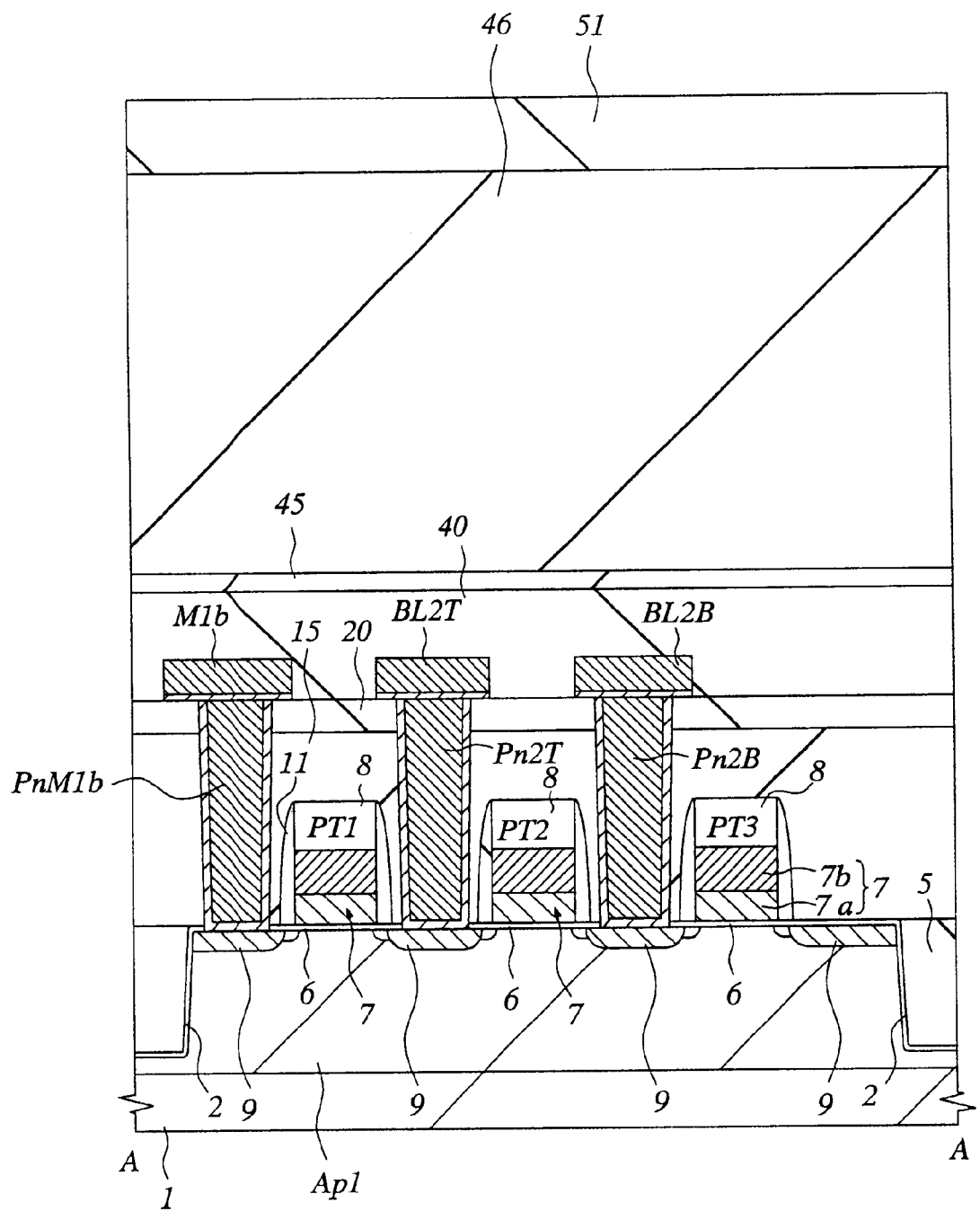
FIG. 9 is a cross-sectional view taken along line A—A of FIG. 8.
Figure 10:
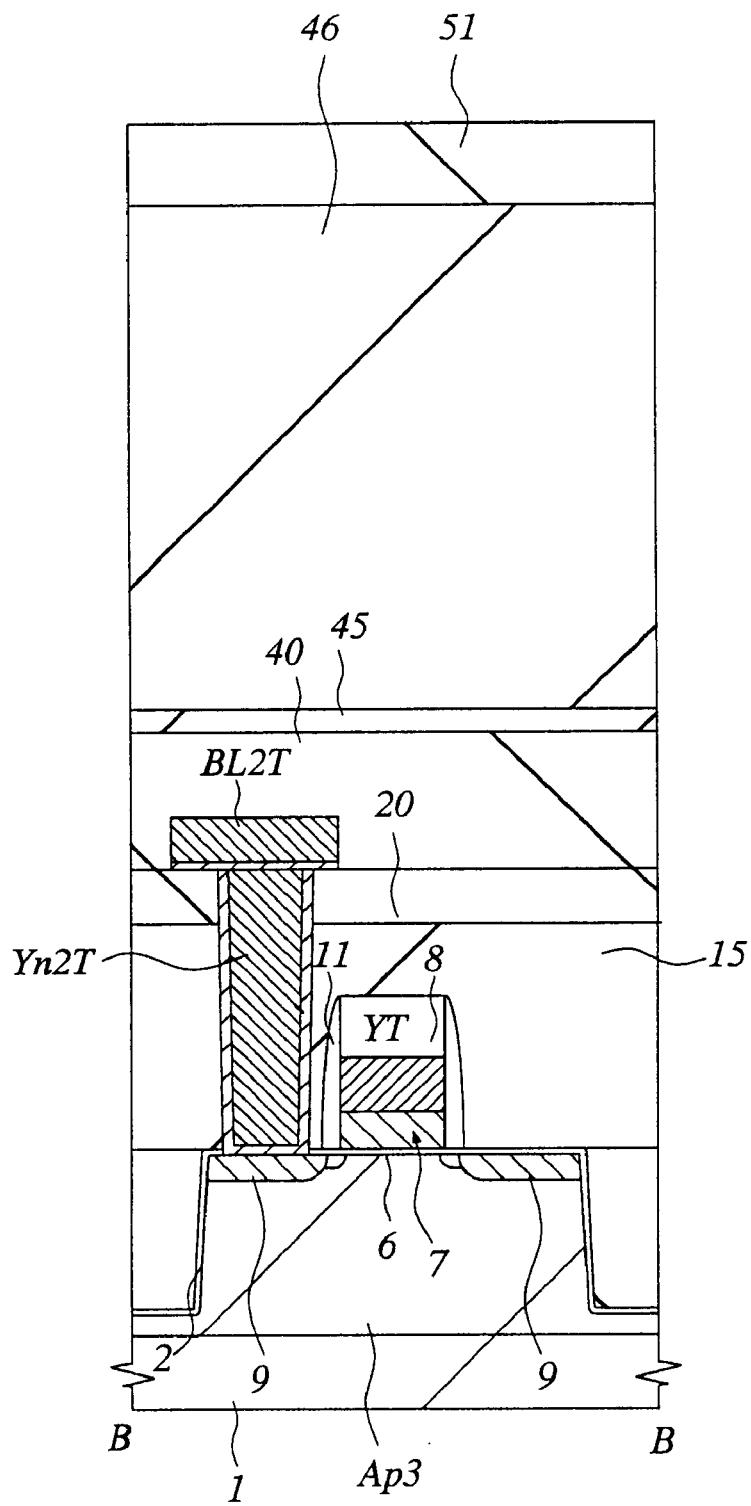
FIG. 10 is a cross-sectional view taken along line B—B of FIG. 8.
Figure 11:
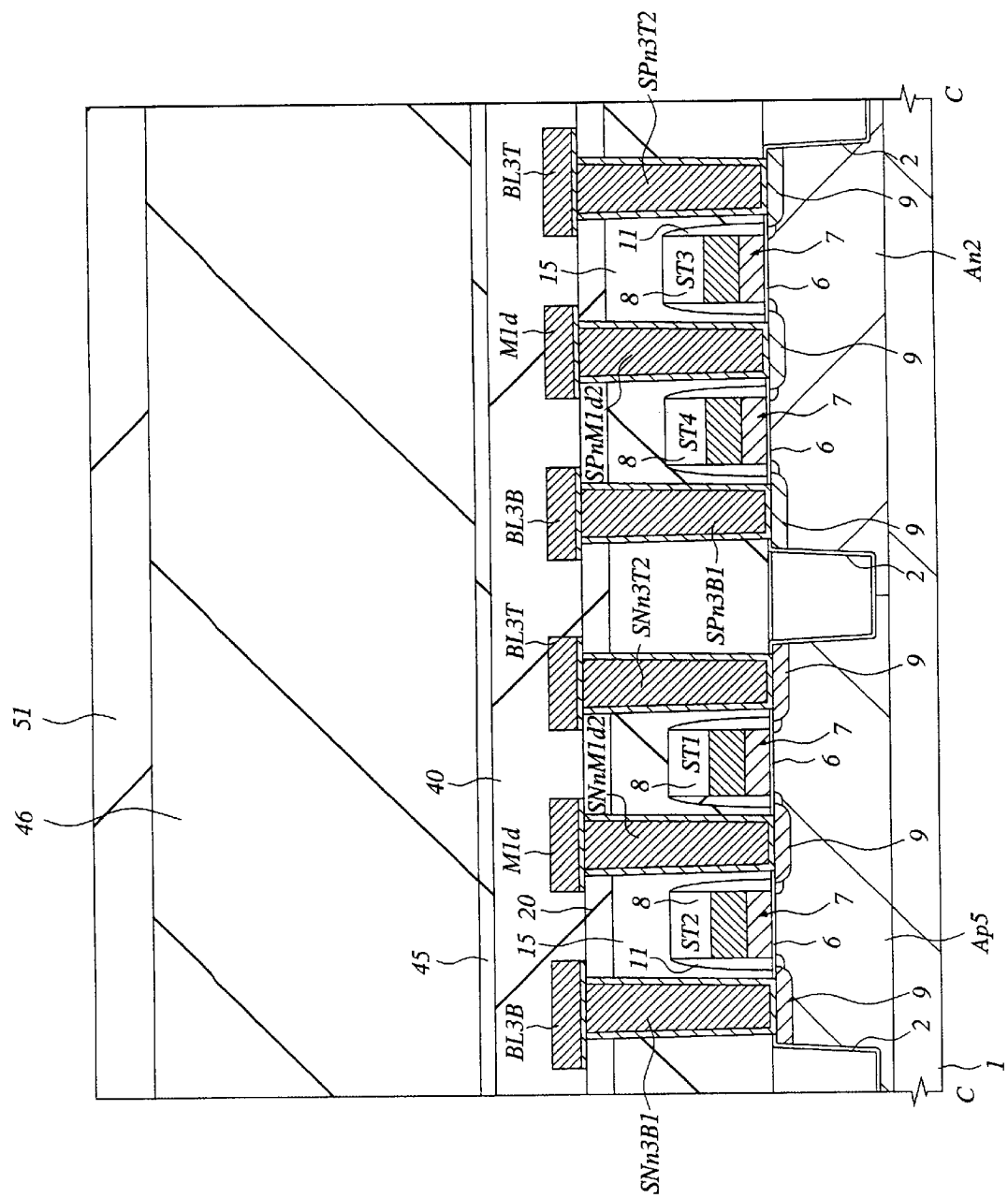
FIG. 11 is a cross-sectional view taken along line C—C of FIG. 8.

FIGS. 6 to 8 are views showing a circuit layout of the sense amplifier formation region. FIGS. 9 to 11 are cross-sectional views showing principal parts of semiconductor substrates taken along lines A—A, B—B and C—C of FIG. 8, respectively. As shown in FIG. 6, in the sense amplifier formation region, p-type well regions Ap1 to Ap6, n-type well regions An1 and An2, and p-type well regions Ap7 to Ap9 are successively arranged in a bit line extending direction (a lateral direction on paper of FIG. 6). Moreover, these p-type well regions Ap1 to Ap6, n-type well regions An1 and An2, and p-type well regions Ap7 to Ap9 are surrounded by element isolation 2 (see FIGS. 7, 8 and 9).

As shown in FIG. 7, the main surface of the p-type well region Ap1 surrounded by the element isolation 2 respectively has MISFETs PT1 to PT3 constituting the pre-charge circuit PC11 and MISFETs PT1 to PT3 constituting the pre-charge circuit PC12, which are formed thereon. In FIG. 7, half tone screening portions show the gate electrodes 7, and black square portions on the halftone screening portions show connecting portions of the gate electrodes 7 and the bit lines BL. Moreover, in FIG. 7, the other black square portions show connecting portions between the p-type well region Ap5 or the like (semiconductor substrate 1), and the bit lines BL or the first layer wiring M1. FIG. 8 shows a view in which reference numerals are given to the black square portions of FIG. 7.

As shown in FIG. 9, for example, each of MISFETs PT1 to PT3 constituting the pre-charge circuit PC11 has the gate electrode 7 formed on the p-type well region Ap1 (semiconductor substrate 1) through the gate oxide film 6, and the source-drain region 9 which has an LDD structure and is formed on both sides of this gate electrode 7. The gate electrode 7 comprises a laminated film formed of a polycrystalline silicon film 7a having a low resistance, a WN film (not shown), and a W film 7b. An upper and side portions of each gate electrode 7 are covered with silicon nitride films 8 and 11.

And, as shown in FIGS. 8 and 9, a plug PnM1b is formed on the source-drain region 9 of the MISFET PT1 constituting the pre-charge circuit PC11. Further, a first layer wiring M1b is formed on this plug PnM1b (see FIGS. 8 and 12). A plug Pn2T is formed on the source-drain region 9 common to the MISFETs PT1 and PT2. Further, the bit line BL2T is formed on the plug Pn2T (see FIGS. 8 and 12). A plug Pn2B is formed on the source-drain region 9 common to the MISFETs PT2 and PT3. Further, the bit line BL2B is formed on the plug Pn2B (see FIGS. 8 and 12). As described above, reference numerals 51 and 46 denote silicon oxide films, and 45 denotes a silicon nitride film, and further, reference numerals 40, 20 and 15 denote silicon oxide films. As described herein after, a second layer wiring is formed on the silicon oxide film 51, and further, a third layer wiring is formed on the second layer wiring via an interlayer dielectric.

The pre-charge circuits PC12, PC21 and PC22 individually have the same structure as the above pre-charge circuit PC11. Each of the MISFETs PT1 to PT3 constituting the pre-charge circuits PC21 and PC22 is formed on the main surface of the p-type well region Ap9.

As shown in FIG. 7, the MISFET YT constituting the Y-switch circuits YS11 to YS14 is formed on the main surface of the p-type well regions Ap2 and Ap3 surrounded by the element isolation 2. As shown in FIG. 10, for example, the MISFET YT constituting the Y-switch circuit YS11 has the gate electrode 7 formed on the p-type well region Ap3 (semiconductor substrate 1) via the gate oxide film 6, and the source-drain region 9 which has an LDD structure and is formed on both sides of this gate electrode 7. This gate electrode 7 comprises a laminated film formed of a polycrystalline silicon film 7a having a low resistance, a WN film (not shown), and a W film 7b, and an upper and side portions of the gate electrode 7 are covered with the silicon nitride films 8 and 11.

A plug Yn2T is formed on the source-drain region 9 of the MISFET YT constituting the Y-switch circuit YS11 (see FIGS. 8 and 10). Further, the bit line BL2T is formed on the plug Yn2T (see FIGS. 10 and 12). The Y-switch circuits YS12 to YS14 also have the same structure as the Y-switch circuit YS11. The Y-switch circuits YS12 and YS14 are formed on the main surface of the p-type well region Ap2.

Moreover, the Y-switch circuits YS21 to YS24 have the same structure as the Y-switch circuit YS11. The Y-switch circuits YS22 and YS24 are formed on the main surface of the p-type well region Ap7, and the Y-switch circuits YS21 and YS23 are formed on the main surface of the p-type well region Ap8.

As shown in FIG. 7, the n-channel type MISFETs ST1 and ST2 (SAN11, SAN12, SAN21 and SAN22) constituting the sense amplifier circuits SA11, SA12, SA21 and SA22 are formed on the main surface of the p-type well regions Ap4 and Ap5 surrounded by the element isolation 2, respectively. Further, as shown in FIG. 7, the p-channel type MISFETs ST3 and ST4 (SAP11, SAP12, SAP21 and SAP22) constituting the sense amplifier circuits SA11, SA12, SA21 and SA22 is formed on the n-type well regions An1 and An5 surrounded by the element isolation 2.

As shown in FIG. 11, for example, the n-channel type MISFETs ST1 and ST2 (SAN21) constituting the sense amplifier circuit SA 21 has the gate electrode 7 formed on the p-type well region Ap5 (semiconductor substrate 1) via the gate oxide film 6, and the source-drain region 9 which has an LDD structure and is formed on both sides of the gate electrode 7. The gate electrode 7 comprises a laminated film formed of a polycrystalline silicon film 7a having a low resistance, a WN film (not shown), and a W film 7b. An upper and side portions of the gate electrode 7 are covered with the silicon nitride films 8 and 11. Moreover, the p-channel type MISFETs ST3 and ST4 (SAP21) constituting the sense amplifier SA 21 has the gate electrode 7 formed on the p-type well region An2 (semiconductor substrate 1) via the gate oxide film 6, and the source-drain region 9 which has an LDD structure and is formed on both sides of the gate electrode 7. The gate electrode 7 also comprises a laminated film formed of a polycrystalline silicon film 7a having a low resistance, a WN film (not shown), and a W film 7b. An upper and side portions of the gate electrode 7 are covered with the silicon nitride films 8 and 11.

A plug SNn3B1 is formed on the source-drain region 9 of the n-channel type MISFET ST2 constituting the sense amplifier circuit SA21 (see FIGS. 8 and 11). Further, the bit line BL3B is formed on the plug SNn3B1 (see FIGS. 11 and 12). Moreover, a plug SNnM1d2 is formed on the source-drain region 9 common to the n-channel type MISFETs ST1 and ST2 constituting the sense amplifier circuit SA21 (see FIGS. 8 and 11). A first layer wiring M1d is formed on the plug SNnM1d2 (see FIGS. 11 and 12). And, a plug SNn3T2 is formed on the source-drain region 9 common to the n-channel type MISFET ST1 constituting the sense amplifier circuit SA21 (see FIGS. 8 and 11). The bit line BL3T is formed on this plug SNn3T2 (see FIGS. 11 and 12).

A plug SPn3B1 is formed on the source-drain region 9 of the p-channel type MISFET ST3 constituting the sense amplifier circuit SA21 (see FIGS. 8 and 11). Further, the bit line BL3B is formed on the plug SPn3B1 (see FIGS. 11 and 12). Moreover, a plug SPnM1d2 is formed on the source-drain region 9 common to the n-channel type MISFETs ST3 and ST4 constituting the sense amplifier circuit SA21 (see FIGS. 8 and 11). A first layer wiring M1d is formed on the plug SPnM1d2. Moreover, a plug SPn3T2 is formed on the source-drain region 9 of the p-channel type MISFET ST4 constituting the sense amplifier circuit SA21 (see FIGS. 8 and 11). The bit lines BL3T is formed on the plug SPn3T2 (see FIGS. 11 and 12).

The sense amplifier circuits SA11, SA 12 and SA22 also have the same structure. The n-channel type MISFETs ST1 and ST2 (SAN11, SAN12) constituting the sense amplifier circuits SA11 and SA12 are formed on the p-type well region Ap4 (semiconductor substrate 1). The p-channel type MISFETs ST1 and ST2 (SAP11, SAP12) constituting the sense amplifier circuits SA11 and SA12 are formed on the n-type well region An1 (semiconductor substrate 1).

The MISFET DT1 is formed in the p-type well region Ap6 positioning between the p-type well region Ap5 and the n-type well region An1. The MISFET DT1 also has the gate electrode 7 formed on the p-type well region Ap6 (semiconductor substrate 1) via the gate oxide film 6, and the source-drain region 9 which has an LDD structure and is formed on both sides of the gate electrode 7. The gate electrode 7 comprises a laminated film formed of a polycrystalline silicon film 7a having a low resistance, a WN film (not shown), and a W film 7b. An upper and side portions of the gate electrode 7 are covered with silicon nitride films 8 and 11.

Figure 12:
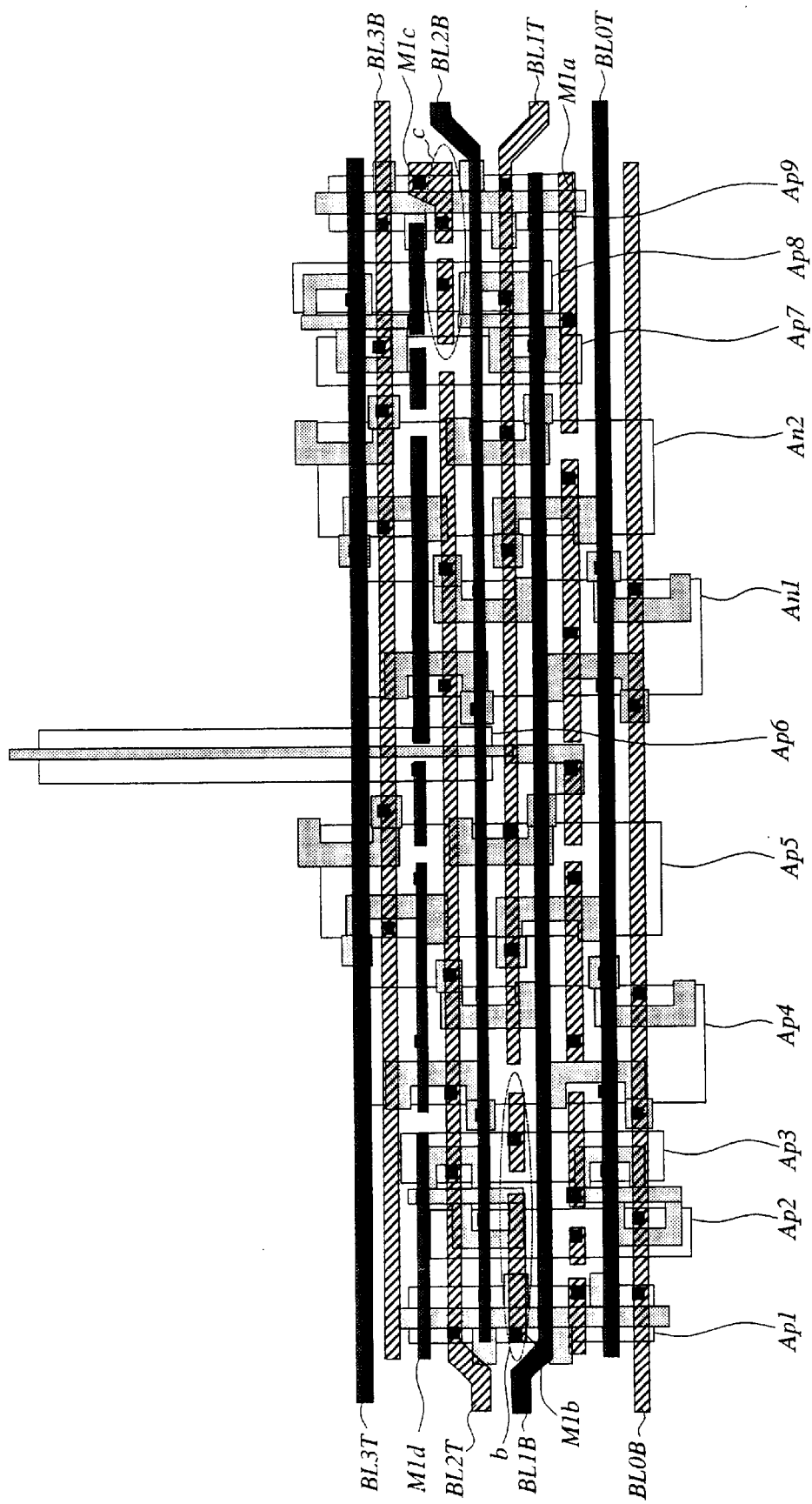
FIG. 12 is a view showing a circuit layout of the sense amplifier formation region of the semiconductor integrated circuit device that is one embodiment of the present invention.

The bit line BL or the first layer wiring M1 is arranged on the black square portions shown in FIG. 8 (see FIG. 12).

The bit line BL3T is formed on nodes SNn3T1, SNn3T2, SPn3T1, SPn3T2, Yn3T and Pn3T, and the bit line BL3B is formed on nodes SNn3B1, SNn3B2, SPn3B1, SPn3B2, Yn3B and Pn3B (see FIG. 10). Further, the bit line BL2T is formed on nodes Pn2T, Yn2T, SNn2T1, SNn2T2, SPn2T1 and SPn2T2, and the bit line BL2B is formed on nodes Pn2B, Yn2B, SNn2B1, SNn2B2, SPn2B1 and SPn2B2 (see FIG. 10). Further, the bit line BL1T is formed on nodes SNn1T2, SNn1T1, SPn1T1, SPn1T2, Yn1T and Pn1T, and the bit line BL1B is formed on nodes SNn1B1, SNn1B2, SPn1B1, SPn1B2, Yn1B and Pn1B (see FIG. 10). Further, the bit line BL0T is formed on nodes Pn0T, Yn0T, SNn0T2, SNn0T1, SPn0T2 and SPn0T1, and the bit line BL0B is formed on nodes Pn0B, Yn0B, SNn0B1, SNn0B2, SPn0B1 and SPn0B2 (see FIG. 10).

Moreover, the first layer wiring M1$d$ is formed on YnM1$d$3, SNnM1$d$1, SNnM1$d$2, Dn1, Dn2, SPnM1$d$1, SPnM1$d$2, YnM1$d$2 and YnM1$d$1 (see FIG. 8). Further, a first layer wiring M1a is formed on PnM1$a$, YnM1$a$3, YnM1$a$2, SNnM1$a$1, SNnM1$a$2, Dn3, SPnM1$a$1, SPnM1$a$2 and YnM1$a$1 (see FIG. 8).

In this preferred embodiment, the pre-charge circuits PC1 and PC2 and the Y-switch circuits YS1 and YS2 are arranged on both sides (Ap1 to Ap3 and Ap7 to Ap8) of the sense amplifier formation region in a state of being divided. Therefore, for example, since the bit line BL1T is connected to the memory cell (a second memory cell formation region described in claims) arranged on the right-hand side of FIG. 12, it is unnecessary to extend the bit line BL1T to one end (Ap1 to Ap3) of the sense amplifier formation region. As a result, a region b shown in FIG. 12 can be used as a region of a wiring other than the bit line. In the region b, there exist nodes PnM1$b$ and YnM1$b$. Further, the first layer wiring M1$b$ is formed on these nodes PnM1$b$ and YnM1$b$ (see FIGS. 8 and 12).

On the other hand, since the bit line BL2T is connected to the memory cell (a first memory cell formation region described in claims) arranged on the left-hand side of FIG. 12, it is unnecessary to extend the bit line BL2T to the other end (Ap7 to Ap9) of the sense amplifier formation region. As a result, a region c shown in FIG. 12 can be used as a region of a wiring other than the bit line. In the region c, there exist nodes YnM1$c$, PnM1$c$1 and PnM1$c$2. Further, the first layer wiring M1$c$ is formed on these nodes YnM1$c$, PnM1$c$1 and PnM1$c$2 (see FIGS. 8 and 12). In this case, halftone screening drawn on the bit lines BL0T to BL3T and BL0B to BL3B, and the first layer wirings M1a to M1$d$ shown in FIG. 12 means to be formed by such a Levelson type mask that these lines and wirings are alternately covered with different shifters.

As described above, according to this present embodiment, an open bit line type sense amplifier is employed, and a plurality of formation regions (Ap4 and Ap5) for n-channel type MISFET (ST1 and ST2) constituting the sense amplifier can be formed, and these formation regions are arranged in a state of being shifted. Therefore, an interval between the bit lines can be made narrower. Moreover, since a plurality of formation regions (An1 and An2) for p-channel type MISFET (ST3 and ST4) constituting the sense amplifier can be formed and these formation regions are arranged in a state of being shifted, the interval between the bit lines can be made narrower.

Further, in the present embodiment, the pre-charge circuits PC11, PC12, PC21 and PC22 are arranged on both sides of the sense amplifier formation region in state of being divided, and the Y-switch circuits YS11 to YS14 and YS21 to YS24 are arranged on both sides of the sense amplifier formation region in a state of being divided. Therefore, since a bit line pair is connected to either the Y-switch circuit YS1 and the pre-charge circuit PC1 existing in both sides of the sense amplifier, or the pre-charge circuit PC2 and the Y-switch circuit YS2, one of the bit line pair may be extended to the midway of the sense amplifier formation region. As a result, it is possible to use regions (e.g., the regions b and c shown in FIG. 12) for forming both the pre-charge circuit not connected to the bit lines and the Y-switch circuit, as a wiring region for arranging wirings other than bit lines.

Figure 18:
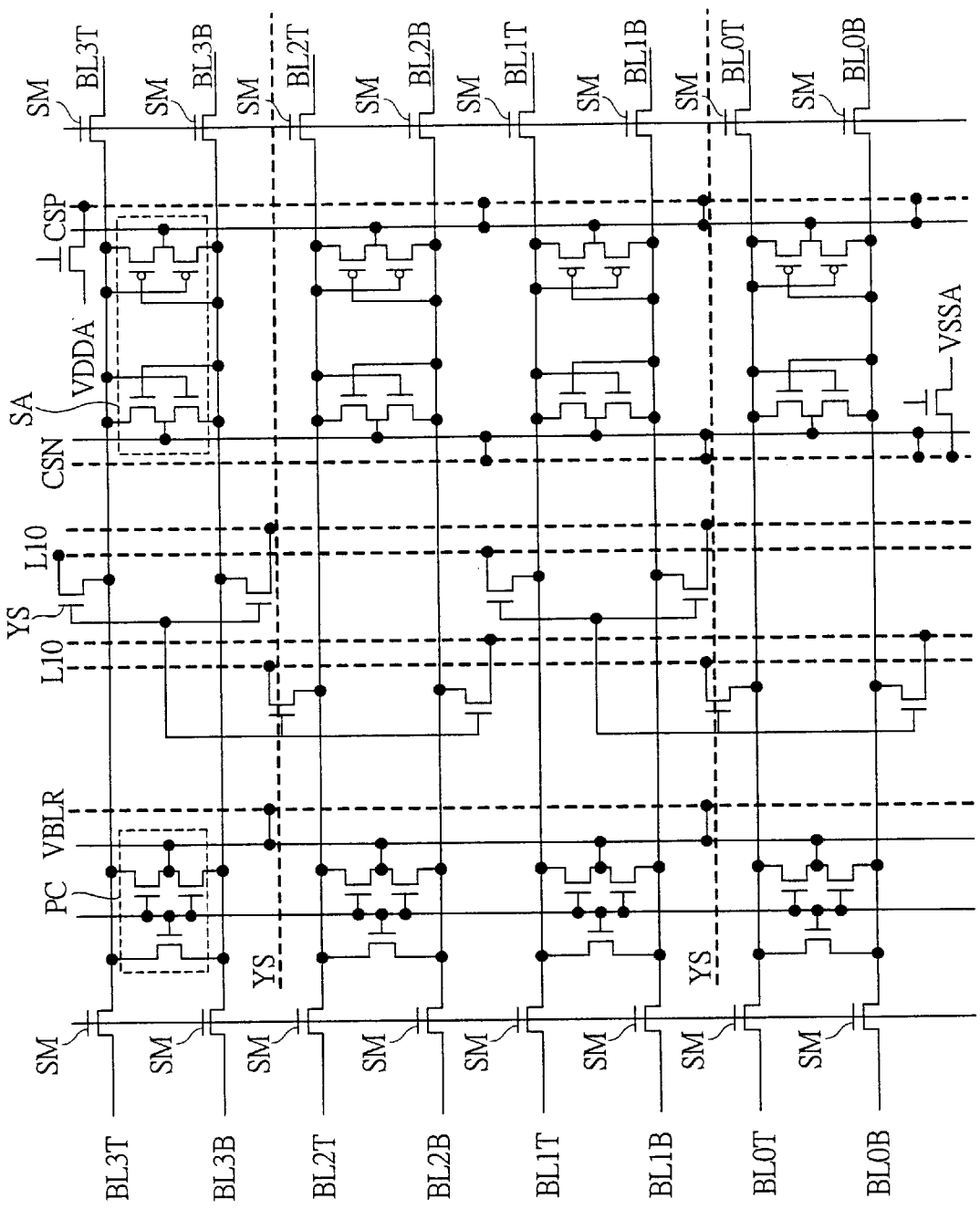
FIG. 18 is an explanatory view for solving the problems of the present invention.
Figure 19:
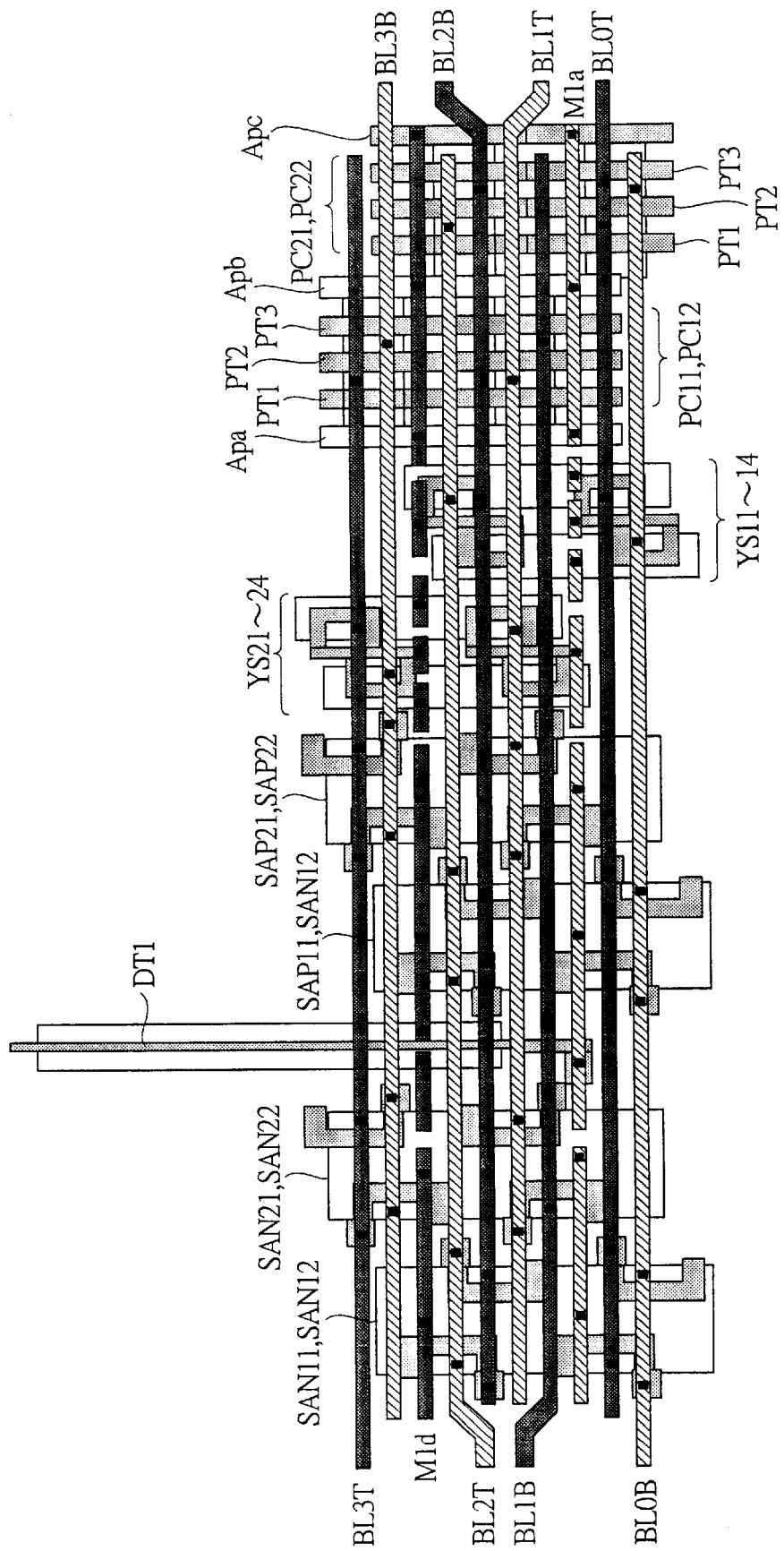
FIG. 19 is a view showing a circuit layout of another sense amplifier formation region of the present invention.

On the contrary, as shown in FIG. 18, if the pre-charge circuits PC11, PC12, PC21 and PC22 and the Y-switch circuits YS11 to YS14 and YS21 to YS24 are arranged on one end of the sense amplifier formation region, the bit line pair is extended over the substantially whole of the sense amplifier formation region. As a result, it is impossible to secure a wiring region for arranging wirings other than bit lines included in the regions b and c shown in FIG. 12. It is noted that FIG. 18 is a view showing a circuit layout of the case where the pre-charge circuits PC11, PC12, PC21 and PC22 and the Y-switch circuits YS11 to YS14 and YS21 to YS24 are arranged on one end of the sense amplifier formation region.

Moreover, according to the layout shown in FIG. 18, since it is impossible to secure a wiring region for arranging wirings other than bit lines included in the regions b and c shown in FIG. 12, the gate electrodes of MISFETs TP1 and TP3 among the MISFETs TP1 to TP3 constituting the pre-charge circuits PC11, PC12, PC21 and PC22 can not be arranged vertically to the gate electrode of the MISFET TP2 (arranged like comb). Thus, as shown in FIG. 18, the gate electrodes of these MISFETs TP1 to TP3 constituting the pre-charge circuits PC11, PC12, PC21 and PC22 are formed in parallel, so that the occupancy area of the pre-charge circuits becomes large.

In addition, according to the layout shown in FIG. 18, since it is impossible to secure a wiring region for arranging wirings other than bit lines included in the regions b and c shown in FIG. 12, the p-type well regions (Apa to Apc) are provided which form the plugs for connecting the first layer wiring M1 to the source-drain region of the MISFETs TP1 and TP3 constituting the pre-charge circuits PC11, PC12, PC21 and PC22. As a result, the occupancy area of the pre-charge circuits becomes large.

However, according to the present embodiment, as described above, it is possible to use a region on the pre-charge circuit and Y-switch circuit formation regions (e.g., the regions b and c shown in FIG. 12) to which the bit lines are not connected, as a wiring region for arranging wirings other than bit lines, so that each layout of the MISFETs constituting the pre-charge circuits can be optimized. Therefore, the occupancy area of the sense amplifier formation regions can be reduced.

Moreover, in case where the bit lines BL of the memory cell formation region shown in FIG. 4 are formed by using a Levelson mask which is a line and space, the bit lines are formed whose phases are alternately different from each other. The bit lines (BL0T to BL3T and BL0B to BL3B) of the sense amplifier formation region, which are connected to the bit lines BL of the memory cell formation region, must have the same phase. Thus, the first layer wirings M1$a$ and M1$d$ formed in parallel to the bit lines shown in FIG. 12 must be formed such that phases thereof are different from those of the adjacent bit lines and that a pitch between the wirings is considered. Therefore, there occurs the problem that it is difficult to form much of wirings such as the wirings M1a and M1d in the sense amplifier formation region.

In order to solve the above problem, in the present embodiment, since a wiring region for arranging wirings other than bit lines can be secured on each line extending along the bit lines included in the regions b and c shown in FIG. 10, it is possible to readily form wirings without considering phases thereof and each pitch therebetween.

Figure 13:
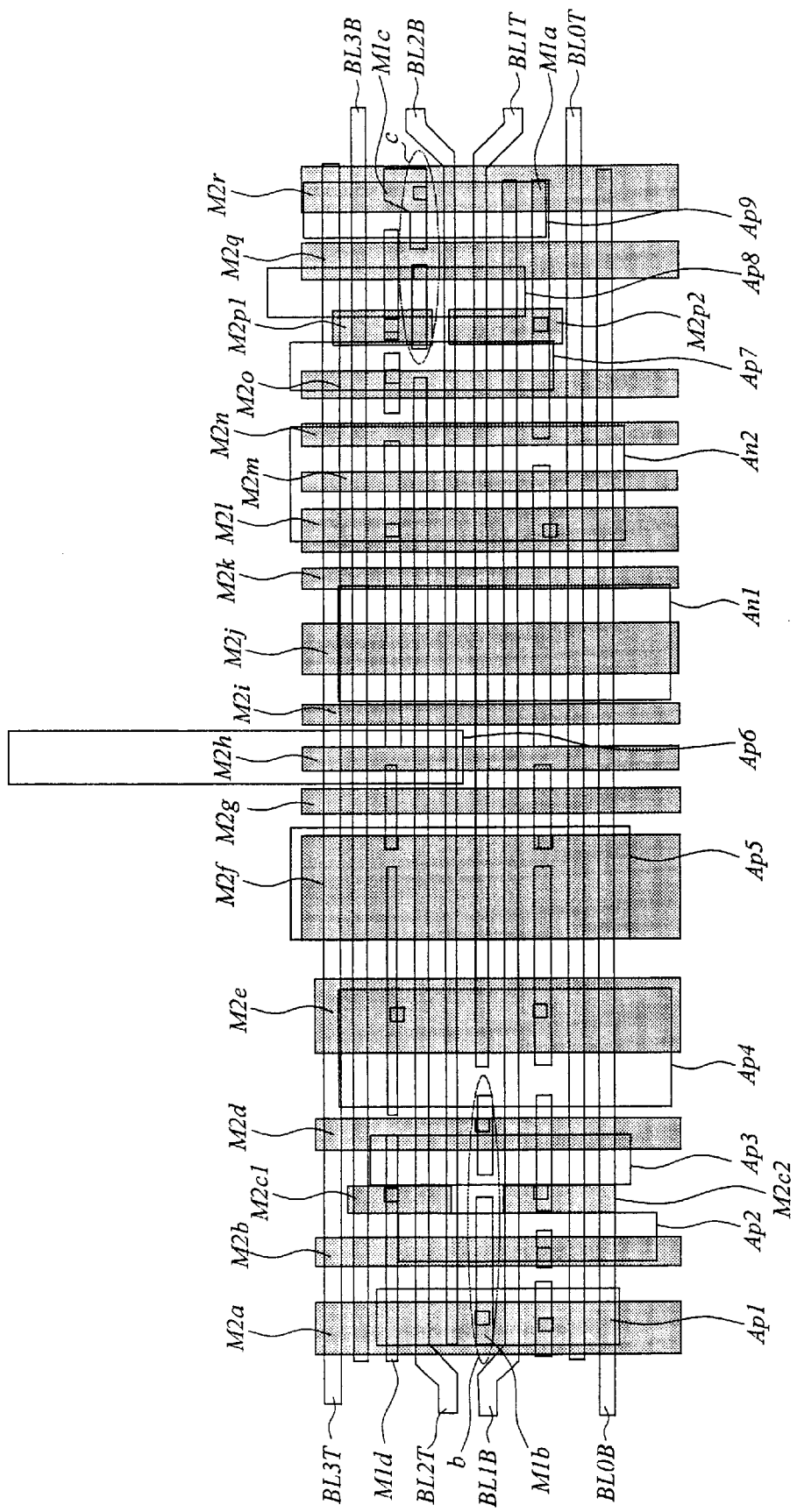
FIG. 13 is a view showing a circuit layout of the sense amplifier formation region of the semiconductor integrated circuit device that is one embodiment of the present invention.

FIG. 13 is a view showing a circuit layout of the case where second layer wirings M2a to M2r are formed on both the bit lines (BL0T to BL3T and BL0B to BL3B) and the first layer wirings M1a to M1d shown in FIG. 12. As shown in FIG. 13, the second layer wirings M2a to M2r extend in a direction perpendicular to the first layer wirings (M1a, etc.). Square marked portions shown in FIG. 13 show connecting portions between the first layer wirings M1a to M1d and the second layer wirings M2a to M2r.

The second layer wiring M2a (VBLR line) is connected to the first layer wirings M1b and M1a formed on the p-type well region Ap1. The second layer wiring M2b (ILO line) is connected to the first layer wiring M1a formed on the p-type well region Ap2. The second layer wiring M2c1 (YS line) is connected to the first layer wiring M1d formed on a region between the p-type well regions Ap2 and Ap3. The second layer wiring M2c2 (YS line) is connected to the first layer wiring M1a formed on a region between the p-type well regions Ap2 and Ap3. The second layer wiring M2d (ILO line) is connected to the first layer wiring M1b formed on a region between the p-type well regions Ap3 and Ap4. The second layer wiring M2e (CSN line) is connected to the first layer wirings M1a and M1d formed on the p-type well region Ap4. The second layer wiring M2f (CSN line) is connected to the first layer wirings M1a and M1d formed on the p-type well region Ap5.

The second layer wiring M2l (CSP line) is connected to the first layer wirings M1a and M1d formed on the n-type well region An2. The second layer wiring M2o (ILO line) is connected to the first layer wiring M1d formed on the p-type well region Ap7. The second layer wiring M2p1 (YS line) is connected to the first layer wiring M1d formed on a region between the p-type well regions Ap7 and Ap8. The second layer wiring M2p2 (YS line) is connected to the first layer wiring M1a formed on a region between the p-type well regions Ap7 and An8. The second layer wiring M2q (ILO line) is connected to the first layer wiring M1c formed on the p-type well region Ap8. The second layer wiring M2r (VBLR line) is connected to the first layer wiring M1c formed on the p-type well region Ap9.

Other second layer wirings (M2g to M2k, M2m, and M2n) are, for example, wirings connected to the gate electrodes of the MISFETs DT1 and DT2, or wirings for feeding the n-type well regions An1 and An2 to power, or wirings for feeding the p-type well regions Ap1 to Ap9 to power, or the like.

Figure 14:
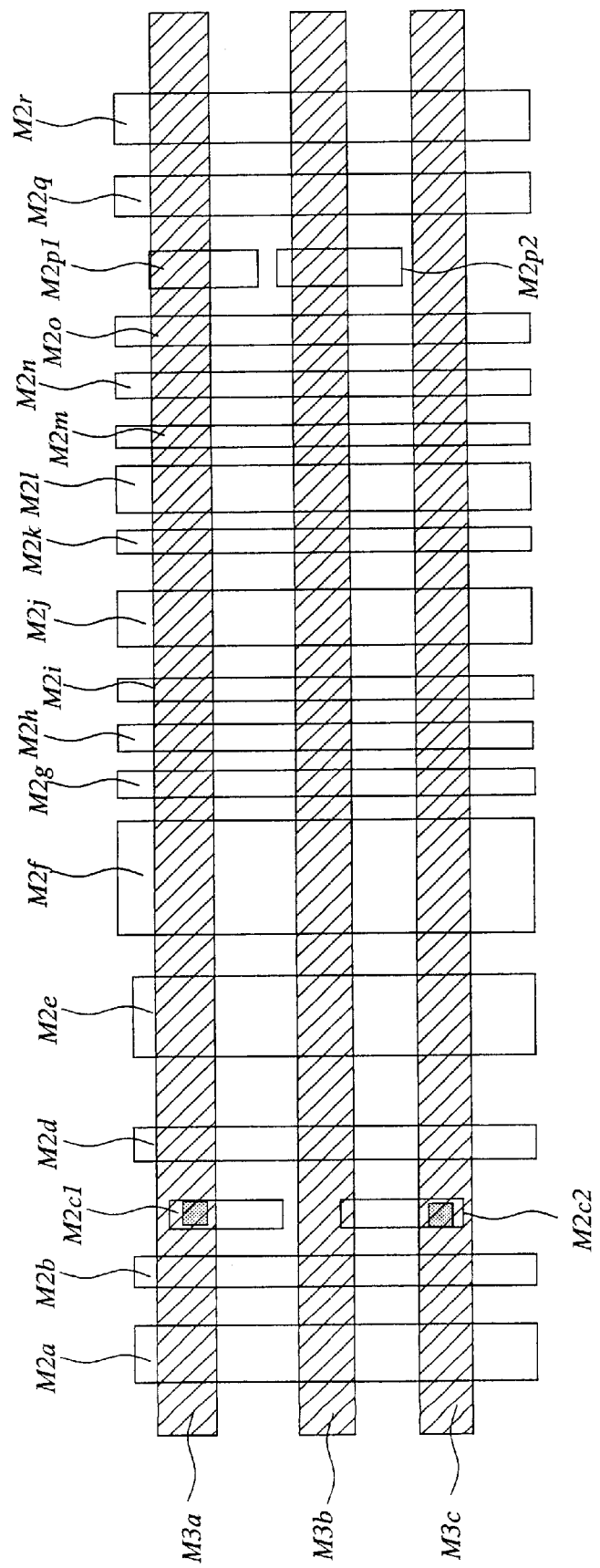
FIG. 14 is a view showing a circuit layout of the sense amplifier formation region of the semiconductor integrated circuit device that is one embodiment of the present invention.

FIG. 14 is a view showing a circuit layout of the case where third layer wirings M3a to M3c are formed on the second layer wirings M2a to M2r shown in FIG. 13. As shown in FIG. 14, the third layer wirings M3a to M3c extend in a direction perpendicular to the second layer wirings (M2a, etc.). Halftone screening square marked portions of FIG. 14 show connecting portions between the second layer wirings M2c1 to M2c2 and the third layer wirings M3a to M3c. The third layer wiring M3a is connected to the second layer wiring M2c1. The third layer wiring M3c is connected to the second layer wiring M2c2. The third layer wiring M3b is a power supply wiring.

Figure 15:
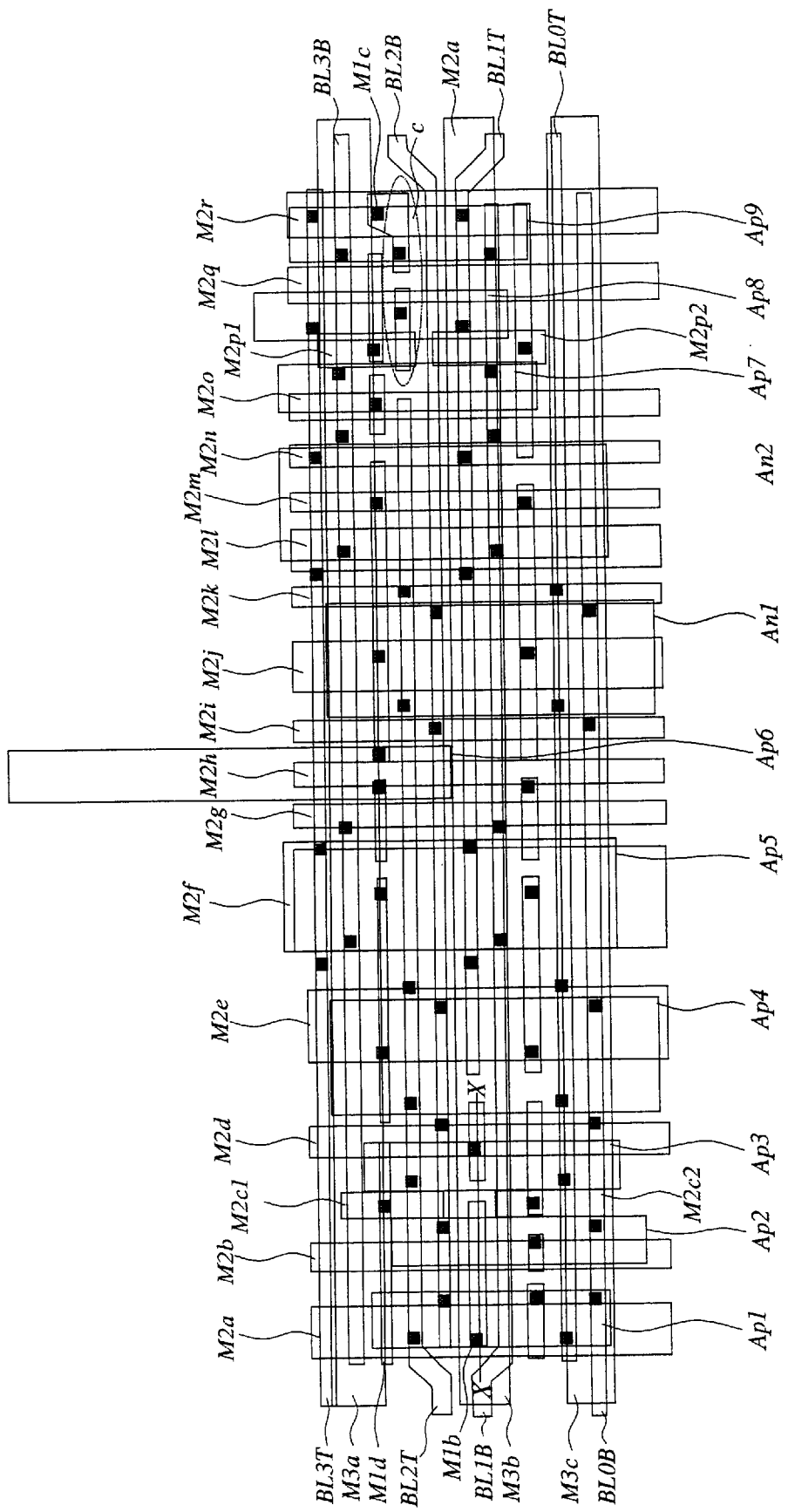
FIG. 15 is a view showing a circuit layout of the sense amplifier formation region of the semiconductor integrated circuit device that is one embodiment of the present invention.

FIG. 15 is a view showing a circuit layout of the case where the second layer wirings M2a to M2r and the third layer wirings M3a to M3c are formed on the circuit layout shown in FIG. 12.

Figure 16:
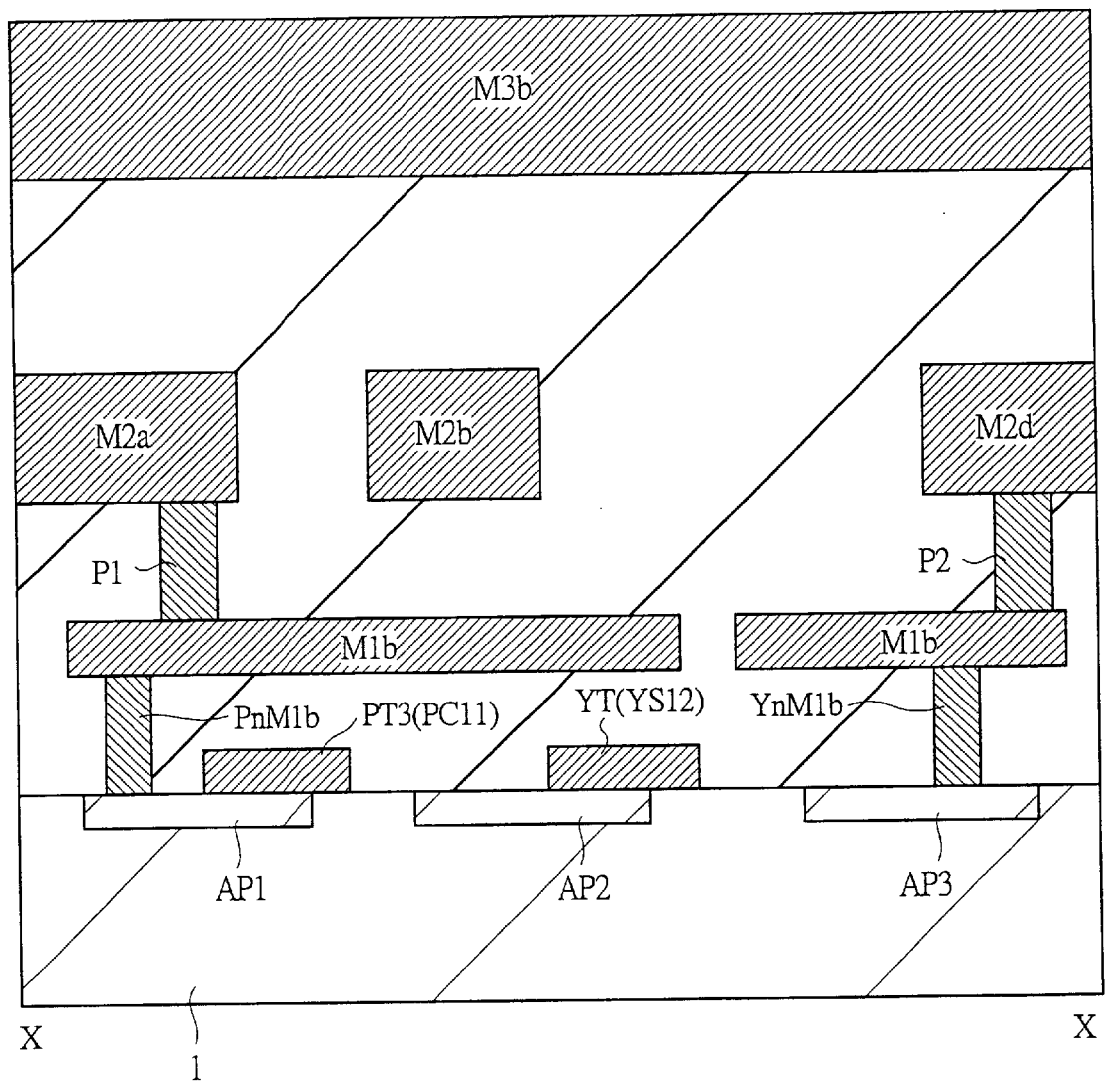
FIG. 16 is a cross-sectional view taken along line X—X of FIG. 15.
Figure 17:
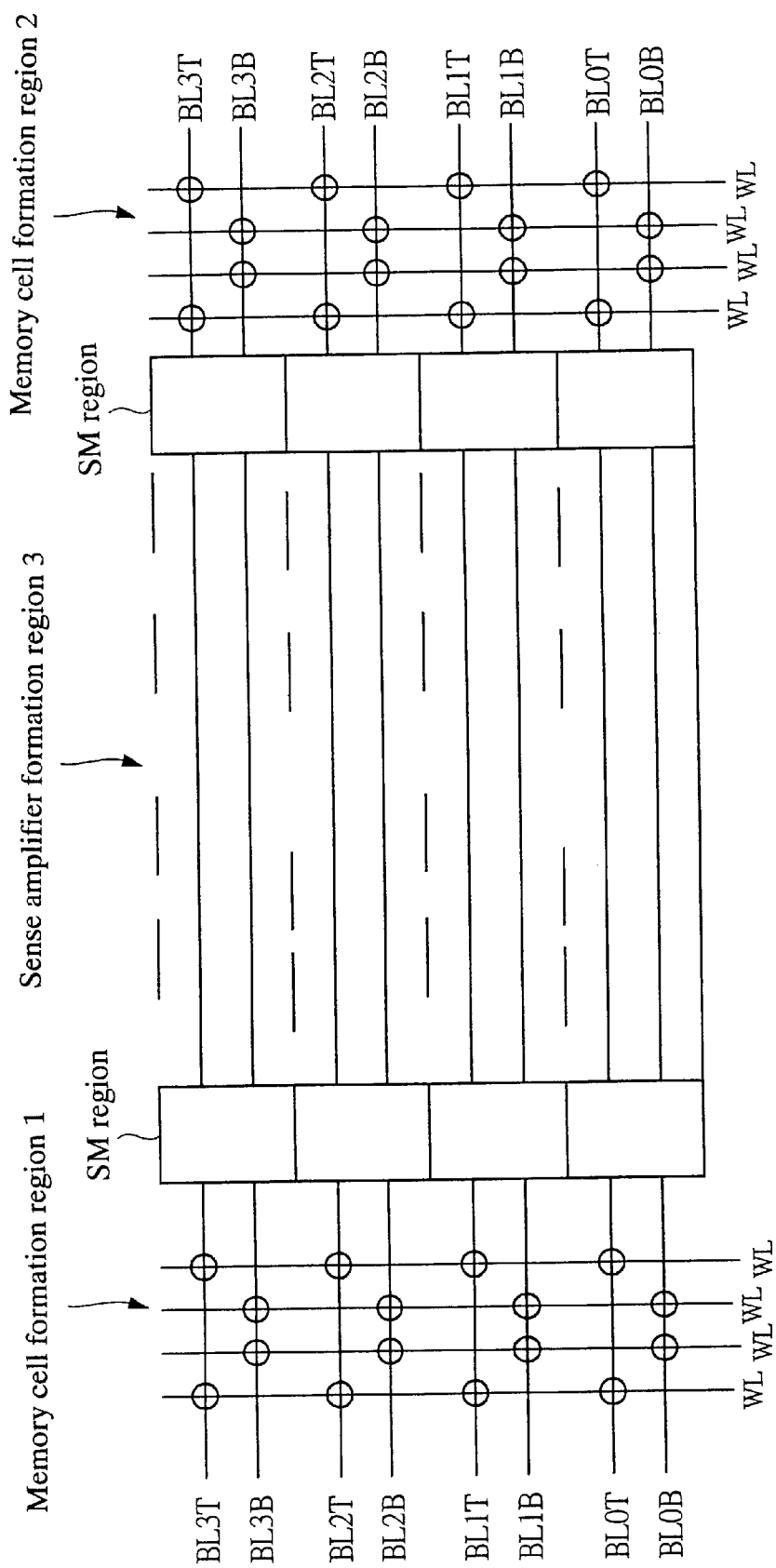
FIG. 17 is an explanatory view for solving the problems of the present invention.

FIG. 16 is a typically cross-sectional view taken along line X—X of FIG. 15. As shown in FIG. 16, the gate electrode of MISFET PT3 constituting the pre-charge circuit PC11 is formed on the p-type well region Ap1, and a plug PnM1b for connecting the source-drain region (not shown) 9 of MISFET PT3 and the first layer wiring M1b is formed thereon. The first layer wiring M1b is connected to the second layer wiring M2a via a plug P1.

A gate electrode of MISFET YT constituting the Y-switch circuit YS12 is formed on the p-type well region Ap2.

A plug YnM1b for connecting the first layer wiring M1b and the source-drain region (not shown) 9 of MISFET YT constituting the Y-switch circuits YS11 and YS13 is formed on the p-type well region Ap3. The first layer wiring M1b is also connected to the second layer wiring M2d via a plug P2.

And, the third layer wiring M3b is formed on the second layer wirings M2a, M2b and M2d.

By doing this, according to the present embodiment, it is possible to secure a wiring region (M1b shown in FIG. 13) for arranging wirings other than the bit lines.

As described above, the invention proposed by the present inventors has been described based on the above-mentioned embodiment, but the present invention is not limited to the above-mentioned embodiment, and needless to say, various changes and modifications can be made without departing from the gist of the present invention.

The following is a brief description on the typical effects obtained from the invention disclosed in the present application.

According to the present invention, the first and second column selecting circuit regions and the first and second pre-charge circuit regions are respectively formed on both ends of the sense amplifier formation region. Therefore, of the first and second memory cell formation regions arranged on both sides of the sense amplifier formation region, the first bit line extending from the first memory cell formation region may extend to the sense amplifier formation region via the first pre-charge circuit region and the first column selecting circuit region. By doing so, it is possible to secure a wiring region for arranging wirings other than bit lines on the first bit line extended. As a result, it is possible to reduce an occupancy area of the sense amplifier formation regions.

Moreover, the sense amplifier circuit region is composed of a first region for forming an n-channel type MISFET constituting a first sense amplifier, a second region for forming an n-channel type MISFET constituting a second sense amplifier, a third region for forming a p-channel type MISFET constituting the second sense amplifier, and a fourth region for forming a p-channel type MISFET constituting the second sense amplifier. And, the second and fourth regions are arranged in a state of being shifted in a direction perpendicular to the bit line relative to the first and third regions. Therefore, it is possible to make an interval between the bit lines connected to the above-mentioned sense amplifier narrower.

As result, it is possible to reduce an occupancy area of the sense amplifier formation region, and to correspond to the bit lines of the memory cell which is made fine.

What is claimed is:

1. A semiconductor integrated circuit device having first and second memory cell formation regions at both ends of a sense amplifier formation region, wherein said sense amplifier formation region comprises:

a sense amplifier circuit region;

a first column selecting circuit region formed between said sense amplifier circuit region and first memory cell formation region;

a second column selecting circuit region formed between said sense amplifier circuit region and second memory cell formation region;

a first pre-charge circuit region formed between said sense amplifier circuit region and first memory cell formation region; and a second pre-charge circuit region formed between said sense amplifier circuit region and second memory cell formation region, wherein first and second bit lines are respectively formed on said first and second memory cell formation regions so as to extend to said sense amplifier formation region, wherein said first bit line extending from said first memory cell formation region extends to said sense amplifier circuit region via said the first pre-charge circuit region and said first column selecting circuit region, and wherein said second bit line extending from said second memory cell formation region extends to said first pre-charge circuit region via said second pre-charge circuit region, said second column selecting circuit region, said sense amplifier circuit region, and said first column selecting circuit region, and wherein a unit sense circuit is formed in said sense amplifier circuit region, said unit sense circuit amplifying the potential difference between said first bit line and said second bit line.

2. The semiconductor integrated circuit device according to claim 1, wherein said sense amplifier circuit region comprises:

a first region for forming an n-channel type MISFET constituting a first sense amplifier;

a second region for forming an n-channel type MISFET constituting a second sense amplifier;

a third region for forming a p-channel type MISFET constituting the second sense amplifier; and a fourth region for forming a p-channel type MISFET constituting the second sense amplifier, in which said first to fourth regions are arranged vertically to said first and second bit lines, and wherein said second and fourth regions are arranged in a state of being shifted in a direction perpendicular to the bit line relative to said first and third regions.

3. The semiconductor integrated circuit device according to claim 1, wherein the first and second pre-charge circuit regions are respectively formed between said first column selecting circuit region and first memory cell formation region, and between said second column selecting circuit region and second memory cell formation region.

4. The semiconductor integrated circuit device according to claim 1, wherein a wiring parallel to said first and second bit lines is formed on said sense amplifier formation region.

5. The semiconductor integrated circuit device according to claim 4, wherein said wiring and said first and second bit lines are formed by a Levelson type mask which is a mask like a line and space and which is covered with shifters whose phases are alternately different from each other.

6. The semiconductor integrated circuit device according to claim 1, further comprising a first bit line pair and a second bit line pair including said first and second bit lines in said sense amplifier formation region, wherein a wiring is formed between said first bit line pair and second bit line pair.

7. The semiconductor integrated circuit device according to claim 6, wherein said wiring, said first bit line pair, and said second bit line pair are formed by a Levelson type mask which is a mask like a line and space and which is covered with shifters whose phases are alternately different from each other.

8. The semiconductor integrated circuit device according to claim 1, wherein a plurality of memory cells comprising a transfer MISFET and a capacitor are formed in said memory cell formation region, and wherein the memory cell is formed at each of all intersecting points of said first and second bit lines and a word line comprising a gate electrode of said transfer MISFET.

9. The semiconductor integrated circuit device according to claim 1, wherein a plurality of bit line pairs are formed in said first and second memory cell formation regions, and wherein all the bit line pairs are constituted by said first and second bit lines.

10. A semiconductor integrated circuit device having first and second memory cell formation regions at both ends of a sense amplifier formation region, wherein said sense amplifier formation region comprises:

a sense amplifier circuit region;

a first column selecting circuit region formed between said sense amplifier circuit region and first memory cell formation region;

a second column selecting circuit region formed between said sense amplifier circuit region and the second memory cell formation region;

a first pre-charge circuit region formed between said sense amplifier circuit region and the first memory cell formation region; and a second pre-charge circuit region formed between said sense amplifier circuit region and the second memory cell formation region, wherein first and second bit lines are respectively formed on said first and second memory cell formation regions so as to extend to said sense amplifier formation region, a first bit line extending from said first memory cell formation region extends to said sense amplifier circuit region via said first pre-charge circuit region and said first column selecting circuit region, and a second bit line extending from said second memory cell formation region extends to said first pre-charge circuit region via said second pre-charge circuit region, said second column selecting circuit region, said sense amplifier circuit region, and said first column selecting circuit region, wherein a unit sense circuit is formed in said sense amplifier circuit region, said unit sense circuit amplifying the potential difference between said first bit line and said second bit line, and wherein a wiring other than a bit line is formed in a line extending from said first bit line and in said second pre-charge circuit region and said second column selecting circuit region.

11. The semiconductor integrated circuit device according to claim 10, wherein said wiring other than the bit line is connected to an input-output line to which one end of MISFET constituting first and second column selecting circuits is connected.

12. The semiconductor integrated circuit device according to claim 10, wherein said wiring other than the bit line is connected to a wiring for supplying a pre-charge potential to the first and second pre-charge circuits.

13. The semiconductor integrated circuit device according to claim 10, wherein said sense amplifier circuit region has:

a first region for forming an n-channel type MISFET constituting a first sense amplifier;

a second region for forming an n-channel type MISFET constituting a second sense amplifier;

a third region for forming a p-channel type MISFET constituting the second sense amplifier; and a fourth region for forming a p-channel type MISFET constituting the second sense amplifier, in which said first to fourth regions are respectively arranged vertically to said first and second bit lines, and wherein said second and fourth regions are arranged in a state of being shifted in a direction perpendicular to the bit line relative to said first and third regions.

14. The semiconductor integrated circuit device according to claim 10, wherein said first and second pre-charge circuit regions are respectively formed between said first column selecting circuit region and said first memory cell formation region, and between said second column selecting circuit region and said second memory cell formation region.

15. The semiconductor integrated circuit device according to claim 10, wherein a wiring parallel to said first and second bit lines is formed in said sense amplifier formation region.

16. The semiconductor integrated circuit device according to claim 10, wherein said wiring and the first and second bit lines are formed by a Levelson type mask which is a mask like a line and space and which is covered with shifters whose phases are alternately different from each other.

17. A semiconductor integrated circuit device having first and second memory cell formation regions at both ends of a sense amplifier formation region, wherein said sense amplifier formation region comprises:

a sense amplifier circuit region;

a first column selecting circuit region formed between said sense amplifier circuit region and the first memory cell formation region;

a second column selecting circuit region formed between said sense amplifier circuit region and the second memory cell formation region;

a first pre-charge circuit region formed between said sense amplifier circuit region and the first memory cell formation region; and a second pre-charge circuit region formed between said sense amplifier circuit region and the second memory cell formation region, wherein first and second bit lines are respectively formed in said first and second memory cell formation regions so as to extend to said sense amplifier formation region, wherein said first bit line extending from said first memory cell formation region extends to said sense amplifier circuit region via said first pre-charge circuit region and said first column selecting circuit region, wherein said second bit line extending from said second memory cell formation region extends to said first pre-charge circuit region via said second pre- charge circuit region, said second column selecting circuit region, said sense amplifier circuit region, and said first column selecting circuit region, wherein one of other bit line and wiring that are parallel and adjacent to said first bit line is formed in said sense amplifier formation region, wherein a unit sense circuit is formed in said sense amplifier circuit region, said unit sense circuit amplifying the potential difference between said first bit line and said second bit line, and wherein a region which is partitioned by said second bit line and said one of other bit line and wiring and which is in said second pre-charge circuit region and said second column selecting circuit region is used as a wiring region for arranging wirings other than bit lines.

18. The semiconductor integrated circuit device according to claim 17, wherein said wiring other than the bit line is connected to an input-output line to which one end of the MISFET constituting first and second column selecting circuits is connected.

19. The semiconductor integrated circuit device according to claim 17, wherein said wiring other than the bit line is connected to a wiring for supplying a pre-charge potential to the first and second pre-charge circuits.

20. The semiconductor integrated circuit device according to claim 17, wherein said sense amplifier circuit region has:

a first region for forming an n-channel type MISFET constituting a first sense amplifier;

a second region for forming an n-channel type MISFET constituting a second sense amplifier;

a third region for forming a p-channel type MISFET constituting the second sense amplifier; and a fourth region for forming a p-channel type MISFET constituting the second sense amplifier, in which said first to fourth regions are respectively arranged vertically to said first and second bit lines, and wherein said second and fourth regions are arranged in a state of being shifted in a direction perpendicular to the bit line relative to said first and third regions.

21. The semiconductor integrated circuit device according to claim 17, wherein said first and the second pre-charge circuit regions are respectively formed between said first column selecting circuit region and the first memory cell formation region, and between said second column selecting circuit region and the second memory cell formation region.

22. The semiconductor integrated circuit device according to claim 17, wherein a wiring parallel to said first and second bit lines is formed in said sense amplifier formation region.

23. The semiconductor integrated circuit device according to claim 17,
wherein said wiring and said first and second bit lines are formed by a Levelson type mask which is a mask like a line and space and which is covered with shifters whose phases are alternately different from each other.

24. A semiconductor integrated circuit device having first and second memory cell formation regions at both ends of a sense amplifier formation region,
wherein said sense amplifier formation region comprises:
a sense amplifier circuit region;
a first column selecting circuit region formed between said sense amplifier circuit region and the first memory cell formation region;
a second column selecting circuit region formed between said sense amplifier circuit region and the second memory cell formation region;
a first pre-charge circuit region formed between said sense amplifier circuit region and the first memory cell formation region; and
a second pre-charge circuit region formed between said sense amplifier circuit region and the second memory cell formation region,
wherein first and second bit lines are respectively formed in the first and second memory cell formation region so as to extend to the sense amplifier formation region, and
wherein a unit sense circuit is formed in said sense amplifier circuit region, said unit sense circuit amplifying the potential difference between said first bit line and said second bit line, and
wherein one of a first bit line extending from said memory cell formation region and a second bit line extending from said second memory cell formation region and making a pair with said first bit line arrives at said sense amplifier circuit region in said sense amplifier formation region.

25. The semiconductor integrated circuit device according to claim 24,
wherein said sense amplifier circuit region has:
a first region for forming an n-channel type MISFET constituting a first sense amplifier;
a second region for forming an n-channel type MISFET constituting a second sense amplifier;
a third region for forming a p-channel type MISFET constituting the second sense amplifier; and
a fourth region for forming a p-channel type MISFET constituting the second sense amplifier, in which said first to fourth regions are respectively arranged vertically to said first and second bit lines, and
wherein said second and fourth regions are arranged in a state of being shifted in a direction perpendicular to the bit line relative to said first and third regions.

26. The semiconductor integrated circuit device according to claim 24,
wherein said first and second pre-charge circuit regions are respectively formed between said first column selecting circuit region and the first memory cell formation region, and between said second column selecting circuit region and the second memory cell formation region.

27. The semiconductor integrated circuit device according to claim 24,
wherein a wiring parallel to said first and second bit lines is formed in said sense amplifier formation region.

28. The semiconductor integrated circuit device according to claim 27,
wherein said wiring and the first and second bit lines are formed by a Levelson type mask which is a mask like a line and space and which is covered with shifters whose phases are alternately different from each other.

29. The semiconductor integrated circuit device according to claim 24, further comprising a second bit line pair parallel to a first bit line pair including said first and second bit lines in said sense amplifier formation region,
wherein a wiring is formed between said first and second bit line pairs.

30. The semiconductor integrated circuit device according to claim 29,
wherein said wiring and the first and second bit line pairs are formed by a Levelson type mask which is a mask like a line and space and which is covered with shifters whose phases are alternately different from each other.

31. The semiconductor integrated circuit device according to claim 24,
wherein a plurality of memory cells comprising a transfer MISFET and a capacitor are formed in said memory cell formation region, and
wherein the memory cell is formed at each of all intersecting points of a word line comprising a gate electrode of said transfer MISFET and said first and second bit lines.

32. The semiconductor integrated circuit device according to claim 24,
wherein a plurality of bit line pairs are formed in said first and second memory cell formation regions, and
wherein all the bit line pairs are constituted by said first and second bit lines.

33. A semiconductor integrated circuit device having first and second memory cell formation regions at both ends of a sense amplifier formation region,
wherein said sense amplifier formation region comprises:
a sense amplifier circuit region;
a first column selecting circuit region formed between said sense amplifier circuit region and the first memory cell formation region;
a second column selecting circuit region formed between said sense amplifier circuit region and the second memory cell formation region;
a first pre-charge circuit region formed between said sense amplifier circuit region and the first memory cell formation region; and
a second pre-charge circuit region formed between said sense amplifier circuit region and the second memory cell formation region,
wherein first and second bit lines extending to said sense amplifier formation region are formed in said first and second memory cell formation regions,
wherein a unit sense circuit is formed in said sense amplifier circuit region, said unit sense circuit amplifying the potential difference between said first bit line and said second bit line, and
wherein a first bit line extending from said first memory cell formation region, and a second bit line extending from said second memory cell formation region and making a pair with said first bit line are different from each other in length in said sense amplifier formation region.

34. A semiconductor integrated circuit device having first and second memory cell formation regions at both ends of a sense amplifier formation region, wherein said first and second memory cell formation regions comprise memory cells formed at all intersecting points of word lines and bit lines in said first and second memory cell formation regions.

wherein said sense amplifier formation region comprising:

a sense amplifier circuit region;

a first column selecting circuit region formed between said sense amplifier circuit region and first memory cell formation region;

a second column selecting circuit region formed between said sense amplifier circuit region and second memory cell formation region;

a first pre-charge circuit region formed between said sense amplifier circuit region and first memory cell formation region; and a second pre-charge region formed between said sense amplifier circuit region and second memory cell formation region, wherein first and second bit lines are respectively formed on said first and second memory cell formation regions so as to extend to said sense amplifier formation region, wherein said first bit line extending from said first memory cell formation region extends to said sense amplifier circuit region via said the first pre-charge circuit region and said first column selecting circuit region, wherein said second bit line extending from said second memory cell formation region extends to said first pre-charge circuit region via said second pre-charge circuit region, said second column selecting circuit region, said sense amplifier circuit region, and said first column selecting circuit region, said second bit line being longer than said first bit line and wherein a unit sense circuit is formed in said sense amplifier circuit region, said unit sense circuit amplifying the potential difference between said first bit line and said second bit line.

35. A semiconductor integrated circuit device according to claim 10, wherein said second bit line is longer than said first bit line.

36. A semiconductor integrated circuit device according to claim 17, wherein said second bit line is longer than said first bit line.

37. A semiconductor integrated circuit device according to claim 24, wherein said second bit line is longer than said first bit line.

38. A semiconductor integrated circuit device according to claim 33, wherein said second bit line is longer than said first bit line.

\* \* \* \* \*